US012581682B2

(12) United States Patent
You et al.

(10) Patent No.: US 12,581,682 B2
(45) Date of Patent: Mar. 17, 2026

(54) SEMICONDUCTOR DEVICE AND METHOD OF MANUFACTURING THE SAME

(71) Applicant: Samsung Electronics Co., Ltd., Suwon-si (KR)

(72) Inventors: Sora You, Suwon-si (KR); Kyoungwoo Lee, Suwon-si (KR); Sungmoon Lee, Suwon-si (KR); Seungmin Cha, Suwon-si (KR); Hagju Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 556 days.

(21) Appl. No.: 18/159,200

(22) Filed: Jan. 25, 2023

(65) Prior Publication Data

US 2024/0030326 A1      Jan. 25, 2024

(30) Foreign Application Priority Data

Jul. 19, 2022    (KR) ........................ 10-2022-0088792

(51) Int. Cl.
| | |
|---|---|
| *H10D 30/43* | (2025.01) |
| *H10D 30/67* | (2025.01) |
| *H10D 62/10* | (2025.01) |
| *H10D 84/83* | (2025.01) |

(52) U.S. Cl.
CPC ......... *H10D 30/43* (2025.01); *H10D 30/6735* (2025.01); *H10D 62/121* (2025.01); *H10D 84/83* (2025.01)

(58) Field of Classification Search
CPC ........... H10D 84/0149; H10D 84/0151; H10D 84/834; H01L 23/5386
See application file for complete search history.

(56) References Cited

U.S. PATENT DOCUMENTS

| | | | |
|---|---|---|---|
| 9,947,804 B1 * | 4/2018 | Frougier ............ | H10D 30/6743 |
| 11,251,308 B2 | 2/2022 | Liao et al. | |
| 2019/0164882 A1 | 5/2019 | Chen et al. | |
| 2020/0083220 A1 * | 3/2020 | Park ..................... | H10D 62/115 |
| 2021/0183711 A1 | 6/2021 | Dentoni Litta et al. | |
| 2021/0193821 A1 | 6/2021 | Dentoni Litta et al. | |
| 2021/0351079 A1 | 11/2021 | Su et al. | |

(Continued)

*Primary Examiner* — Brian Turner
(74) *Attorney, Agent, or Firm* — Fish & Richardson P.C.

(57) ABSTRACT

A semiconductor device includes parallel active regions on a substrate and extending in a first horizontal direction; gate structures intersecting the active regions, extending in a second horizontal direction, and including first and second gate structures opposing each other in the second horizontal direction; source/drain regions including first and second source/drain regions, on at least one side of the gate structures and on the active regions; a gate separation pattern between the first and second gate structures; a vertical conductive structure in the gate separation pattern; contact plugs including a first contact plug electrically connected to the first source/drain region and the vertical conductive structure, and a second contact plug electrically connected to the second source/drain region and spaced apart from the vertical conductive structure; and a contact separation pattern separating the first and second contact plugs, having a portion contacting an upper surface of the vertical conductive structure.

20 Claims, 25 Drawing Sheets

(56)　　　　　　References Cited

U.S. PATENT DOCUMENTS

| | | |
|---|---|---|
| 2021/0375861 A1 | 12/2021 | Chung et al. |
| 2021/0376076 A1 | 12/2021 | Su et al. |
| 2021/0399099 A1 | 12/2021 | Chu et al. |
| 2021/0399109 A1* | 12/2021 | Su ........................ H10D 62/121 |
| 2022/0069076 A1 | 3/2022 | Yu et al. |
| 2022/0069116 A1 | 3/2022 | Chen et al. |
| 2022/0102535 A1 | 3/2022 | Wang et al. |
| 2022/0115510 A1 | 4/2022 | Yu et al. |
| 2023/0377985 A1* | 11/2023 | Smith ................... H10D 84/83 |

* cited by examiner

SEMICONDUCTOR DEVICE AND METHOD OF MANUFACTURING THE SAME

CROSS-REFERENCE TO RELATED APPLICATION(S)

This application claims benefit of priority to Korean Patent Application No. 10-2022-0088792 filed on Jul. 19, 2022 in the Korean Intellectual Property Office, the disclosure of which is incorporated herein by reference in its entirety.

BACKGROUND

The present inventive concepts relate to semiconductor devices and methods of manufacturing the same.

As the demand for high performance, high speed, and/or multifunctionality of a semiconductor device increases, a degree of integration of the semiconductor device is increasing. In manufacturing a semiconductor device having a fine pattern corresponding to the trend of high integration of the semiconductor device, it is required to implement patterns having a fine width or a fine separation distance. In addition, in order to overcome the limitations of operating characteristics due to the reduction in size of planar metal oxide semiconductor PETs (MOSFETs), efforts are being made to develop semiconductor devices including FinFETs having a three-dimensional channel structure.

SUMMARY

An aspect of the present inventive concepts are to provide semiconductor devices having improved productivity or electrical characteristics.

According to some aspects of the present inventive concepts, a semiconductor device includes active regions, parallel to each other, on a substrate and respectively extending in a first horizontal direction; gate structures intersecting the active regions on the substrate, extending in a second horizontal direction, and including a first gate structure and a second gate structure opposing each other in the second horizontal direction; source/drain regions including a first source/drain region and a second source/drain region, on at least one side of the gate structures and on the active regions; a gate separation pattern between the first and second gate structures; a vertical conductive structure in the gate separation pattern; contact plugs including a first contact plug electrically connected to the first source/drain region and connected to the vertical conductive structure, and a second contact plug electrically connected to the second source/drain region and spaced apart from the vertical conductive structure; and a contact separation pattern separating the first and second contact plugs between the first and second contact plugs, wherein the contact separation pattern has a portion contacting an upper surface of the vertical conductive structure on the vertical conductive structure.

According to some aspects of the present inventive concepts, a semiconductor device includes a substrate having a first surface and a second surface opposing the first surface; active regions, parallel to each other, on the first surface of the substrate and respectively extending in a first horizontal direction; a plurality of channel layers stacked to be spaced apart from each other in a vertical direction on the active regions; gate structures intersecting the active regions and the plurality of channel layers on the first surface of the substrate, extending in a second horizontal direction, and including a first gate structure and a second gate structure opposing each other in the second horizontal direction; a first source/drain region and a second source/drain region, on at least one side of the gate structures and on the active regions; a gate separation pattern between the first and second gate structures; lower interconnection lines below the second surface of the substrate; a vertical conductive structure in the gate separation pattern and electrically connected to the lower interconnection lines; a contact separation pattern on the vertical conductive structure to contact the vertical conductive structure; and contact plugs including a first contact plug electrically connected to the first source/drain region and the vertical conductive structure, and a second contact plug electrically connected to the second source/drain region and spaced apart from the vertical conductive structure, wherein the contact separation pattern separates the first and second contact plugs between the first and second contact plugs.

According to some aspects of the present inventive concepts, a semiconductor device includes a substrate having a first surface and a second surface opposing the first surface; active regions, parallel to each other, on the first surface of the substrate and respectively extending in a first horizontal direction; gate structures intersecting the active regions on the first surface of the substrate and extending in a second horizontal direction; source/drain regions including a first source/drain region and a second source/drain region, on at least one side of the gate structures and on the active regions; lower interconnection lines on the second surface of the substrate; a vertical conductive structure passing through the substrate and electrically connected to the lower interconnection lines; a contact separation pattern on the vertical conductive structure to contact the vertical conductive structure; and contact plugs including a first contact plug electrically connected to the first source/drain region and the vertical conductive structure, and a second contact plug electrically connected to the second source/drain region and spaced apart from the vertical conductive structure, wherein the contact separation pattern separates the first and second contact plugs between the first and second contact plugs, and a width of an upper portion of the contact separation pattern is narrower than a width of a lower portion of the contact separation pattern, in the second horizontal direction.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, some example embodiments of the present inventive concepts will be described with reference to the accompanying drawings.

Figure 1:
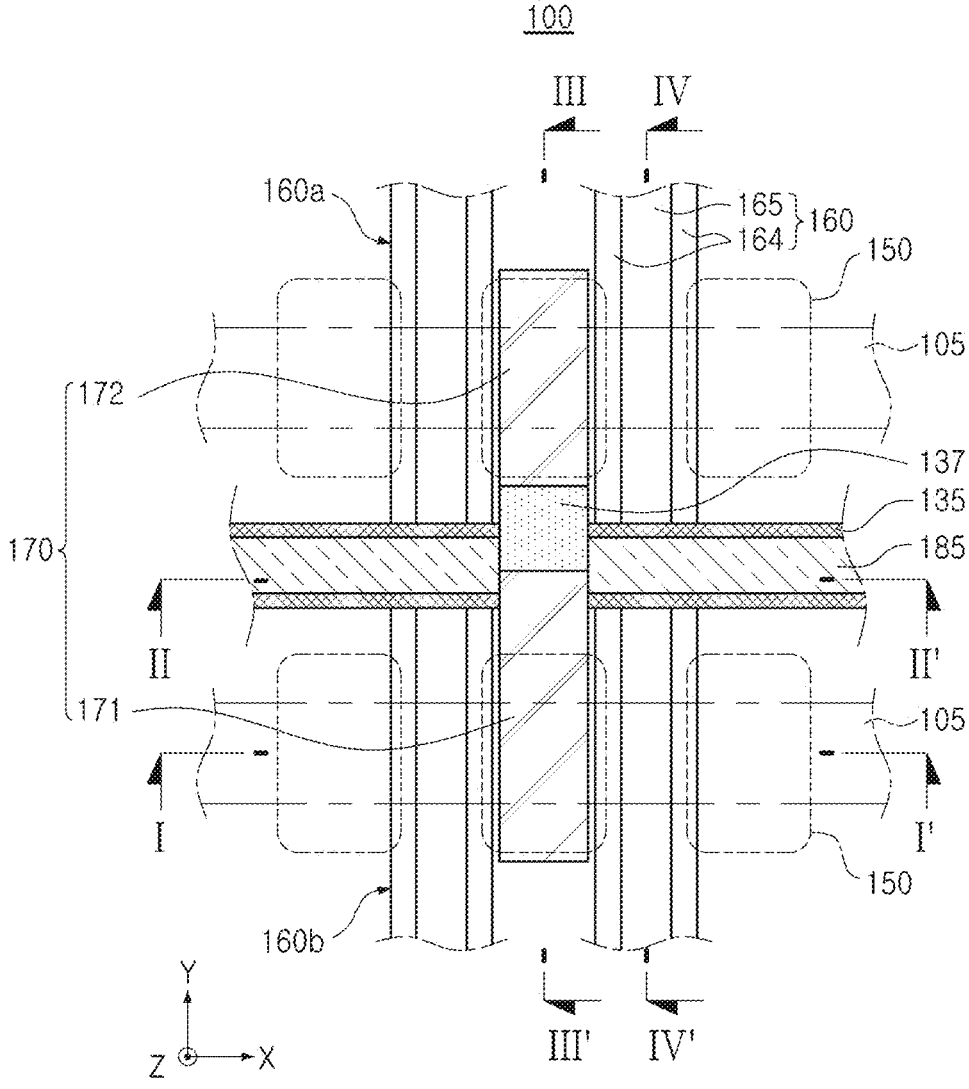
FIG. 1 is a plan view illustrating a semiconductor device according to example embodiments.

FIG. 1 is a plan view illustrating a semiconductor device according to example embodiments.

Figure 2A:
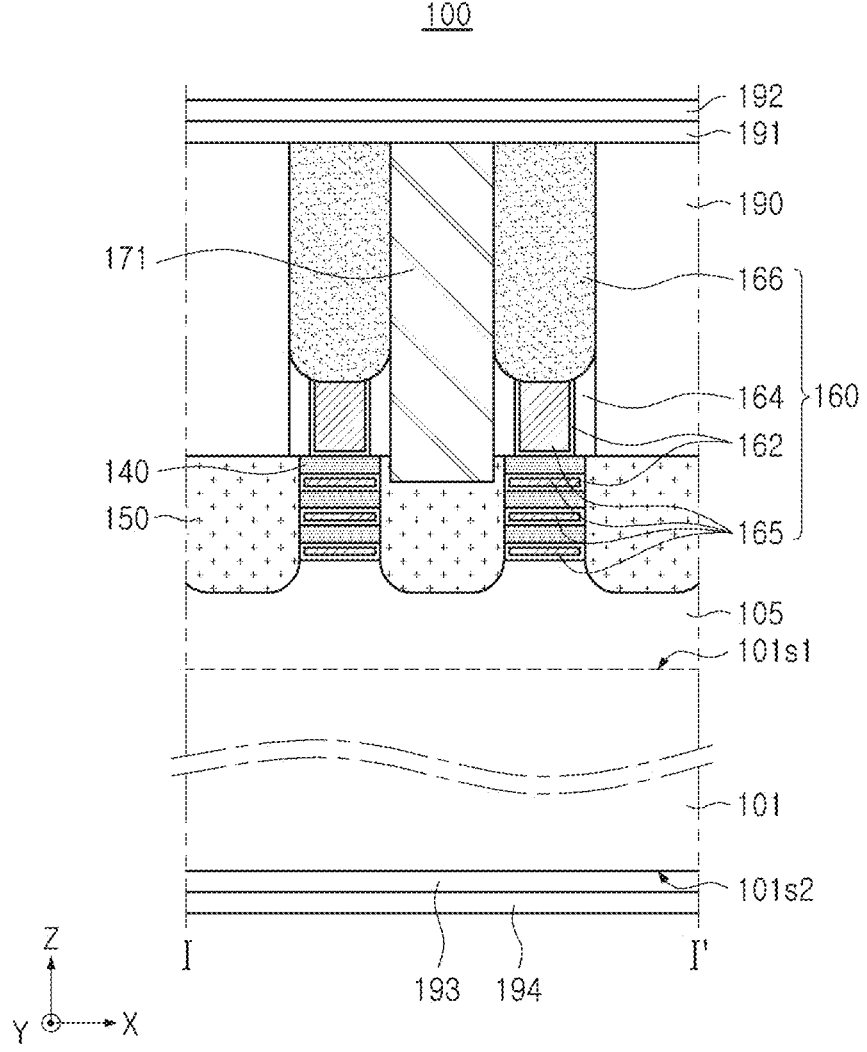
FIGS. 2A, 2B, 2C, and 2D are cross-sectional views illustrating a semiconductor device according to example embodiments.
Figure 2B:
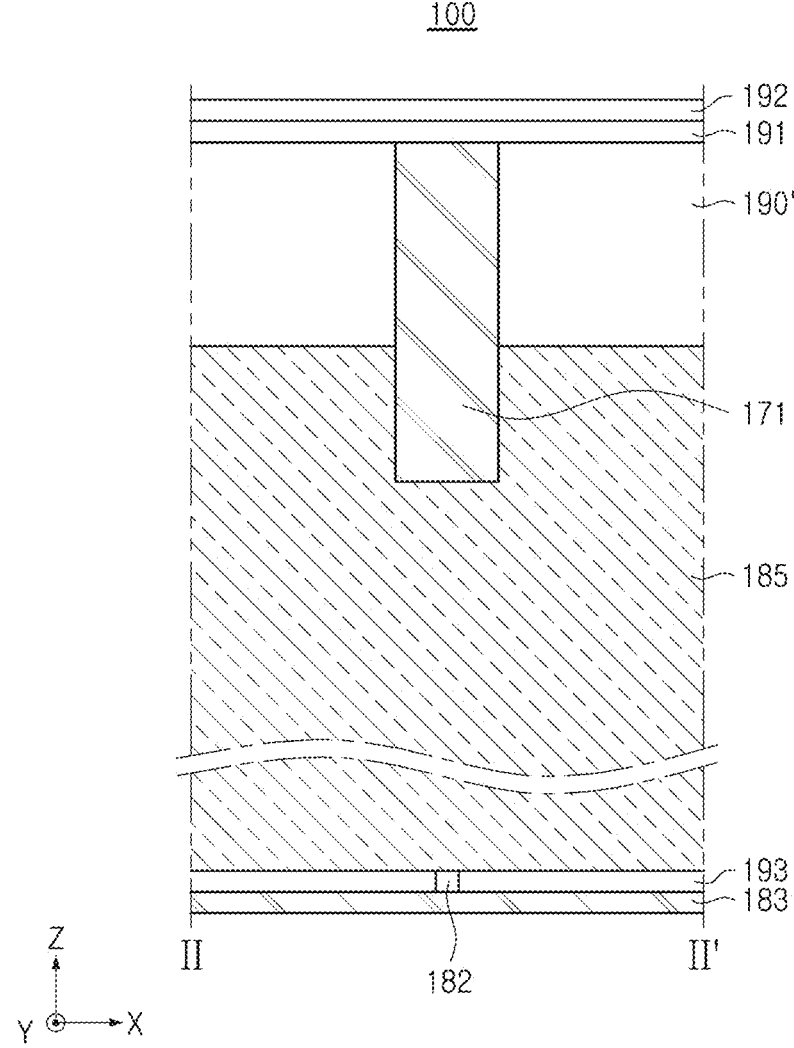
Figure 2C:
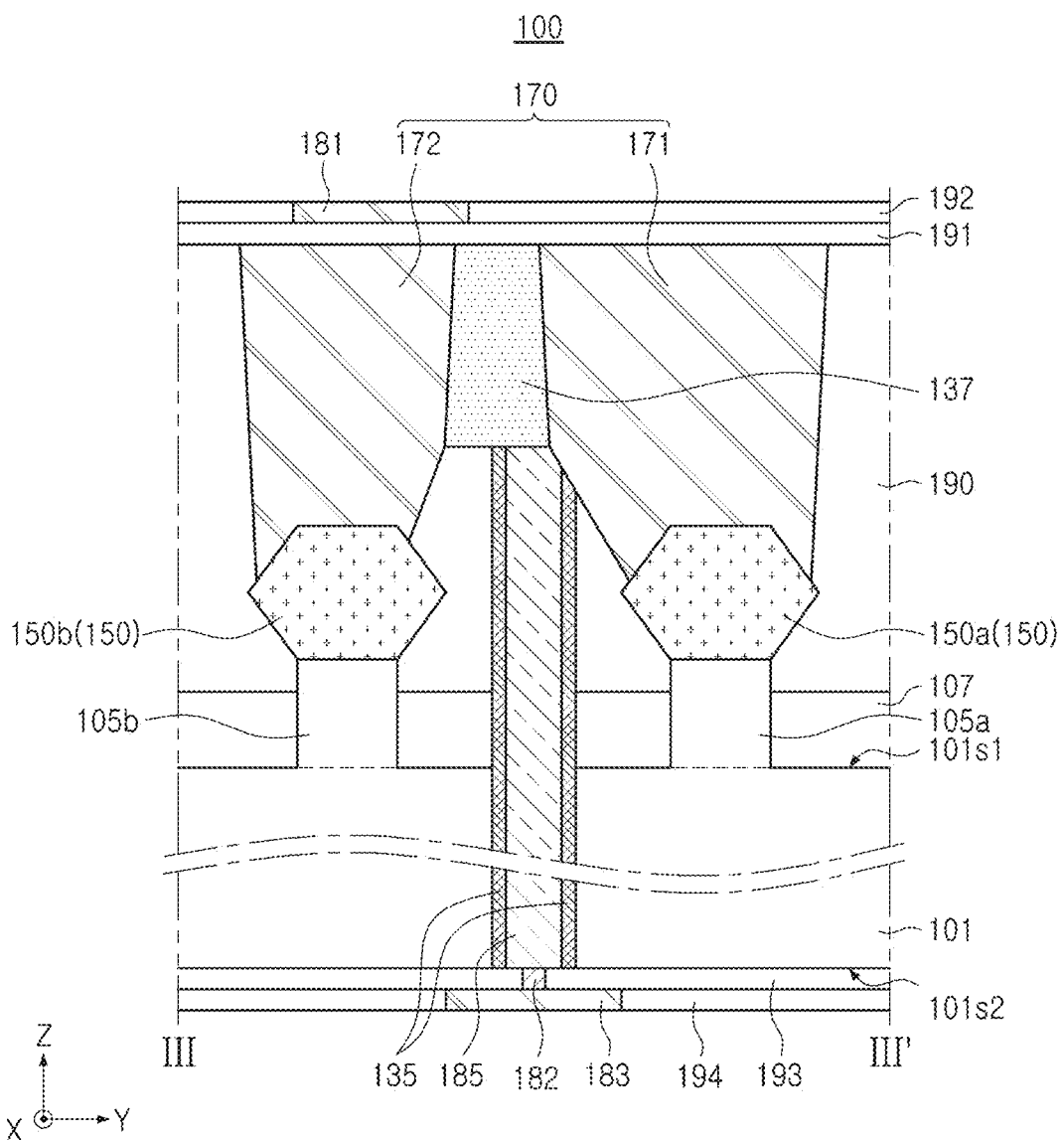
Figure 2D:
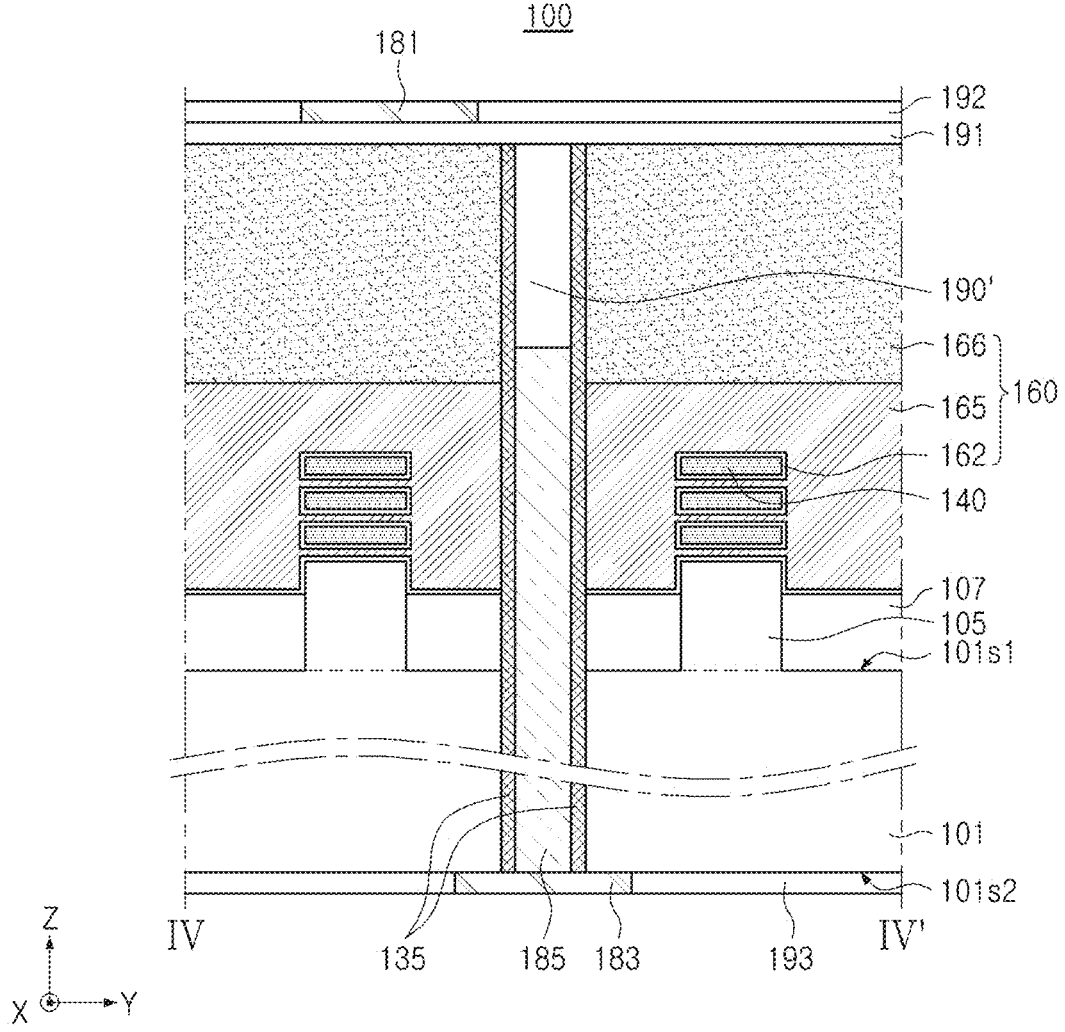

FIGS. 2A to 2D are cross-sectional views illustrating a semiconductor device according to example embodiments. FIG. 2A illustrates a cross-section of the semiconductor device of FIG. 1, taken along line I-I', FIG. 2B illustrates a cross-section of the semiconductor device of FIG. 1, taken along line II-II', FIG. 2C illustrates a cross-section of the semiconductor device of FIG. 1, taken along line III-III', and FIG. 2D illustrates a cross-section of the semiconductor device of FIG. 1, taken along line IV-IV'. For convenience of description, only major components of the semiconductor device are illustrated in FIGS. 1 to 2D.

Referring to FIGS. 1 to 2D, a semiconductor device 100 may include a substrate 101, active regions 105 on the substrate 101, device isolation layers 107 for separating the substrate 101, channel layers 140 disposed on the active regions 105, source/drain regions 150 connected to the channel layers 140, gate structures 160 intersecting the active regions 105 and extending, contact plugs 170, a gate separation pattern 135, and an intermediate insulating layer 190. The gate structures 160 may include a gate dielectric layer 162, a gate electrode 165, a gate spacer 164, and a gate capping layer 166, respectively.

In some example embodiments, the semiconductor device 100 may further include a gate separation pattern 135 separating the gate structures 160, a vertical conductive structure 185 passing through the gate separation pattern 135, and a contact separation pattern 137 separating adjacent contact plugs 170 on the vertical conductive structure 185.

In some example embodiments, the channel layers 140 may be disposed on the active regions 105 to be spaced apart from each other perpendicularly. According to this, the active regions 105 may have a fin structure, and the gate electrode 165 may be disposed between the active regions 105 and a lowermost channel layer 140, may be disposed between the channel layers 140, and may be disposed on an uppermost channel layer 140. Therefore, the semiconductor device 100 may be a transistor of a multi-bridge channel FET (MBCFET™) structure, which may be a gate-all-around type field effect transistor (GAA FET) by the channel layers 140, the source/drain regions 150, and the gate structures 160.

However, unlike descriptions described above according to some example embodiments, the channel structure may be a plurality of fin structures disposed on the active regions 105, not the channel layers spaced vertically spaced apart from each other. According to this, the semiconductor device 100 may be a fin type electric field effect transistor by the channel structure, the source/drain regions 150, and the gate structures 160.

The substrate 101 may have an upper surface extending in an X-direction and a Y-direction. In some example embodiments, the substrate 101 may have a first surface 101$s$1 and a second surface 101$s$2 opposing the first surface 101$s$1, and the first surface 101$s$1 may be the upper surface of the substrate 101.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The active regions 105 may be disposed to extend in a first horizontal direction, which may be parallel to the first surface 101$s$1, which may be the upper surface of the substrate 101, such as in the X-direction. The active regions 105 may be spaced apart in the Y-direction, and may be disposed in parallel. The active regions 105 may protrude in a Z-direction, perpendicular to the upper surface of the substrate 101. Upper end portions of the active regions 105 may be disposed to protrude from an upper end portion of the device isolation layers 107 by a predetermined (e.g., alternatively, desired) height. The active regions 105 may be formed as a portion of the substrate 101, and may include an epitaxial layer growing from the substrate 101. On both sides of the gate structures 160, the active regions 105 on the substrate 101 may be partially recessed, and the source/drain regions 150 may be disposed on the recessed portions of the active regions 105.

The device isolation layers 107 may define the active regions 105 in the substrate 101. The device isolation layers 107 may be disposed between the active regions 105. The device isolation layers 107 may have a height level of the upper end portion, lower than height levels of the upper end portions of the active regions 105. Therefore, the device isolation layers 107 may partially expose upper portions of the active regions 105. In some example embodiments, the device isolation layers 107 may have upper surfaces having a higher height level toward the active regions 105, but are not limited thereto. The device isolation layers 107 may be formed, for example, by a shallow trench isolation (STI) process. The device isolation layers 107 may be formed of an insulating material. The device isolation layers 107 may be, for example, an oxide, a nitride, or a combination thereof.

The channel layers 140 may be spaced apart from each other on the active regions 105 in the Z-direction, perpendicular to the first surface 101$s$1 of the substrate 101. The channel layers 140 may be spaced apart from upper surfaces of the active regions 105 while being connected to the source/drain regions 150. The channel layers 140 may have the same or similar widths as the active regions 105 in the Y-direction, and may have the same or similar widths as the gate structures 160 in the X-direction. According to some example embodiments, the channel layers 140 may have a reduced width to have side surfaces in lower portions of the gate structures 160 in the X-direction. The channel layers 140 are illustrated to include three channel layers, but the number of channel layers may be changed in various manners without limited thereto. For example, according to some example embodiments, the channel layers 140 may further include a channel layer disposed on the upper surfaces of the active regions 105. The channel layers 140 may be formed of semiconductor materials, and may include, for example, at least one of silicon (Si), silicon germanium (SiGe), or germanium (Ge). The channel layers 140 may include the same material, but may include different materials according to some example embodiments.

The source/drain regions 150 may be disposed on the active regions 105, at least one side of the channel layers 140. The source/drain regions 150 may be arranged to cover the upper surface of the active regions 105 on a side surface of each of the channel layers 140 and lower ends of the source/drain regions 150. The source/drain regions 150 may be in contact with the channel layers 140. The source/drain regions 150 may be disposed by partially recessing the upper portions of the active regions 105, but in embodiments, whether the recessing is present and a depth of the recess may be changed in various manners. The source/drain regions 150 may be a semiconductor layer containing silicon (Si), and may be formed of an epitaxial layer.

In some example embodiments, the source/drain regions 150 may include first and second source/drain regions 150a and 150b, disposed on the active regions 105 and adjacent to each other. The first source/drain region 150a may be spaced apart from the second source/drain region 150b in the second horizontal direction, for example the Y-direction.

The gate structures 160 may be disposed to intersect the active regions 105 and the channel layers 140 and extend in the second horizontal direction, which may be one direction, such as the Y-direction. The gate structures 160 may extend to intersect upper portions of the active regions 105 and upper portions of the channel layers 140 on the first surface 101$s$1, which may be the upper surface of the substrate 101. Channel regions of transistors may be formed in the active regions 105 and/or the channel layers 140, intersecting the gate structures 160.

In some example embodiments, the gate structures 160 may include first and second gate structures 160a and 160b, opposing each other in the second horizontal direction. The first and second gate structures 160a and 160b may be physically spaced and electrically separated from each other by the gate separation pattern 135. The first and second gate structures 160a and 160b may have the same or substantially the same width in the X-direction. The first gate structures 160a may be extended in parallel with each other, and the second gate structures 160b may be extended in parallel with each other. The first and second gate structures 160a and 160b may intersect different active regions 105 to configure different transistors.

Each of the gate structures 160 may include a gate dielectric layer 162, a gate electrode 165, a gate spacer 164, and a gate capping layer 166. Each gate structures 160 may have upper and lower surfaces contacting the channel layers 140 between the channel layers 140.

The gate dielectric layer 162 may be disposed between each of the active regions 105 and the gate electrode 165 and between the channel layers 140 and the gate electrode 165, and may be disposed to cover at least a portion of surfaces of the gate electrode 165. For example, the gate dielectric layer 162 may be arranged to surround all surfaces, except for an uppermost surface, of the gate electrode 165. The gate dielectric layer 162 may be extended between the gate electrode 165 and the gate spacer 164, but the present inventive concepts are not limited thereto. The gate dielectric layer 162 may include an oxide, a nitride, and/or a high-κ material. The high-κ material may refer to a dielectric material having a higher dielectric constant than that of a silicon oxide film ($SiO_2$). The high dielectric constant material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$). According to some example embodiments, the gate dielectric layer 162 may be formed of multiple layers.

The gate electrode 165 may be disposed on the active regions 105 to fill a space between the channel layers 140, and extend to upper portions of the channel layers 140. The gate electrode 165 may be spaced apart from the channel layers 140 by the gate dielectric layer 162. The gate electrode 165 may include a conductive material. For example, the conductive material may include a metal nitride such as titanium nitride (TiN), tantalum nitride (TaN), or tungsten nitride (WN), and/or a metal material such as aluminum (Al), tungsten (W), molybdenum (Mo), or the like, or a semiconductor material such as doped polysilicon, or a combination thereof. According to some example embodiments, the gate electrode 165 may be composed of two or more multiple layers. The gate electrode 165 may include different materials, depending on transistor regions.

The gate spacer 164 may be disposed on both side walls of the gate electrode 165, and may be extended in the Z-direction, perpendicular to the upper surface of the substrate 101. The gate spacer 164 may include a portion of which a width of an upper portion is narrower than a width of a lower portion. According to some example embodiments, a shape of the gate spacer 164 may be changed in various manners. The gate spacer 164 may insulate the source/drain regions 150 and the gate electrode 165. The gate spacer 164 may be formed as multiple layers according to some example embodiments. The gate spacer 164 may be formed of an oxide, a nitride, or an oxynitride.

The gate capping layer 166 may be disposed on the gate electrode 165. The gate capping layer 166 may be a structure for protecting the gate electrode 165 from etching in a subsequent process after forming the gate electrode 165, but a role of the gate capping layer 166 is not limited thereto. The gate capping layer 166 may be disposed on the gate electrode 165 and the gate spacer 164, and at least a portion of a lower surface thereof may be surrounded by the gate electrode 165 and the gate spacer 164. In some example embodiments, the gate capping layer 166 may include a lower surface having a convex shape toward the substrate 101. The gate capping layer 166 may include a silicon nitride insulating material and/or a silicon nitride-based insulating material.

According to some example embodiments, the semiconductor device 100 may further include inner spacer layers disposed in parallel with the gate electrode 165 between the channel layers 140. The gate electrode 165 located below an uppermost channel layer, among the channel layers 140, may be spaced apart and electrically separated from the source/drain regions 150 by the inner spacer layers. The inner spacer layers may have a shape in which a side facing the gate electrode 165 is convexly rounded inward toward the gate electrode 165, but the present inventive concepts are not limited thereto. The inner spacer layers may be formed of an oxide, a nitride, or an oxynitride, and in particular, may be formed of a low-κ film. According to some example embodiments, the inner spacer layers may be omitted.

The gate separation pattern 135 may electrically isolate and physically separate the first and second gate structures 160a and 160b between the first and second gate structures 160a and 106b.

In some example embodiments, the gate separation pattern 135 may penetrate the substrate 101 between the active regions 105. A lower surface of the gate separation pattern 135 may be disposed at the same or substantially the same level as the second surface 101s2, which may be a lower surface of the substrate 101, and may be coplanar with the second surface 101s2.

In some example embodiments, the gate separation pattern 135 may have a linear shape extending in the X-direction in a plane, but the present inventive concepts are not limited thereto, and may be a plurality of structures separated from each other and spaced apart from each other.

The gate separation pattern 135 may include at least one of silicon nitride, silicon oxide, silicon oxynitride, and/or a nitride-based material. The gate separation pattern 135 may include the same material as the gate spacer 164, but the present inventive concepts are not limited thereto.

The vertical conductive structure 185 may extend along an inner side surface of the gate separation pattern 135, and may be electrically connected to lower interconnection lines 183. The vertical conductive structure 185 may electrically connect at least a portion of the lower interconnection lines 183 and at least a portion of the contact plugs 170 (e.g., a first contact plug 171).

In some example embodiments, a height level of an upper surface of the vertical conductive structure 185 may be higher than a height level of an upper surface of the uppermost channel layer 140 among the channel layers 140, and may be lower than height levels of upper surfaces of the gate structures 160. The upper surface of the vertical conductive structure 185 may be in contact with the contact separation pattern 137 and the first gate contact plug 171.

A lower surface of the vertical conductive structure 185 may be located on the same or substantially the same level as the second surface 101s2 of the substrate 101, and may be coplanar with the second surface 101s2.

The vertical conductive structure 185 may include a metal material, and may include, for example, at least one of aluminum (Al), tungsten (W), or molybdenum (Mo).

The gate separation pattern 135 may surround an outer side surface of the vertical conductive structure 185. The gate separation pattern 135 may have a uniform or a substantially uniform thickness on the outer side surface of the vertical conductive structure 185. This may be because, after a first insulating material may be filled in an opening corresponding to the gate separation pattern 135 and the vertical conductive structure 185, the first insulating material may be removed by a separate etching process for forming the vertical conductive structure 185, a second insulating material may be conformally deposited on a side wall of the opening to form the gate separation pattern 135, and a conductive material may then be filled to form the vertical conductive structure 185. According to some example embodiments, a separate etching process of filling the opening with the first insulating material and removing the first insulating material as much as a region corresponding to the gate separation pattern 135 may be performed, and the vertical conductive structure 185 may be formed, to prepare a structure according to some example embodiments.

A side surface of the gate separation pattern 135 and a side surface of the vertical conductive structure 185 are illustrated to extend in the vertical Z-direction, but may also have an inclined side surface having a reduced width toward the lower interconnection lines 183.

In some example embodiments, a height level of an uppermost surface of the gate separation pattern 135 may be located to be higher than a height level of an uppermost surface of the vertical conductive structure 185. The gate separation pattern 135 may include a portion protruding upward from the outer side surface of the vertical conductive structure 185. This may be a structure formed by selectively removing a portion of an upper portion of the vertical conductive structure 185 after forming the gate separation pattern 135 and the vertical conductive structure 185. A gap-fill insulating layer 190' may be disposed in a trench formed by the protruding portion of the gate separation pattern 135. The gap-fill insulating layer 190' may include at least one of silicon nitride, silicon carbonitride, or silicon oxynitride. In some example embodiments, the gap-fill insulating layer 190' may include the same material as the intermediate insulating layer 190.

The intermediate insulating layer 190 may cover the source/drain regions 150, the gate structures 160, and the device isolation layers 107. The intermediate insulating layer 190 may include, for example, at least one of an oxide, a nitride, or an oxynitride, and may include a low-κ material.

In some example embodiments, the semiconductor device 100 may further include upper insulating layers 191 and 192 disposed on the intermediate insulating layer 190, and lower insulating layers 193 and 194 disposed on the second surface 101s2, which may be the lower surface of the substrate 101. The upper insulating layers 191 and 192 and the lower insulating layers 193 and 194 may include the same material as the intermediate insulating layer 190, but the present inventive concepts are not limited thereto. The upper insulating layers 191 and 192 and the lower insulating layers 193 and 194 may be formed to have various numbers of layers and various thicknesses, unlike those illustrated in FIGS. 2A to 2D.

In some example embodiments, the semiconductor device 100 may include an upper interconnection structure 181 penetrating the upper insulating layers 191 and 192 and lower interconnection structures 182 and 183 penetrating the lower insulating layers 193 and 194. Each of the upper and lower interconnection structures 181, 182, and 183 may include a conductive material, and, for example, may include a metal nitride such as titanium nitride (TiN), tantalum nitride (TaN), or tungsten nitride (WN), and/or a metal material such as aluminum (Al), tungsten (W), molybdenum (Mo), or the like, or a semiconductor material such as doped polysilicon, or a combination thereof.

The lower interconnection structures 182 and 183 may include lower interconnection vias 182 and lower interconnection lines 183. The lower interconnection lines 183 may include power lines for applying power to the source/drain regions 150 or the gate electrode 165, and the vertical conductive structure 185 may be connected to the power lines, among the lower interconnection lines 183.

The contact plugs 170 may pass through the intermediate insulating layer 190, to be connected to the source/drain regions 150, and may apply an electrical signal to the source/drain regions 150. The contact plugs 170 may include first and second contact plugs 171 and 172 spaced apart from each other. The first contact plug 171 may be electrically connected to the first source/drain region 150a, and the second contact plug 172 may be electrically connected to the second source/drain region 150b. A contact separation pattern 137 may be disposed between the first and second plugs 171 and 172. The first contact plug 171 may be electrically connected to the vertical conductive structure 185 along one side of the contact separation pattern 137, and the second contact plug 172 may be spaced apart from the vertical conductive structure 185 along the other side of the contact separation pattern 137. The first contact plug 171 may be electrically connected to the lower interconnection lines 183 through the vertical conductive structure 185.

The first and second contact plugs 171 and 172 may have inclined side surfaces of which widths decrease toward the substrate 101, according to an aspect ratio, but the present inventive concepts are not limited thereto. In some example embodiments, the first and second contact plugs 171 and 172 may be in contact with the upper surfaces of the source/drain regions 150, and may be recessed to constant depths from the source/drain regions 150 according to some example embodiments.

The contact plugs 170 may include a metal material, and may include, for example, at least one of aluminum (Al), tungsten (W), or molybdenum (Mo).

The contact separation pattern 137 may electrically insulate and physically separate the first and second contact plugs 171 and 172 between the first and second contact plugs 171 and 172.

A height level of an upper surface of the contact separation pattern 137 may be located to be higher than a height level of an upper surface of the vertical conductive structure 185. The contact separation pattern 137 may include a portion on the vertical conductive structure 185 contacting the upper surface of the vertical conductive structure 185. In some example embodiments, a lower surface of the contact separation pattern 137 may be in contact with the upper surface of the vertical conductive structure 185 and the upper surface of the gate separation pattern 135. The lower surface of the contact separation pattern 137 may include a first lower surface contacting the vertical conductive structure 185 and a second lower surface contacting the gate separation pattern 135, wherein the first lower surface may be coplanar or substantially coplanar with the second lower surface.

As the contact separation pattern 137 is formed after a portion of an upper end of the vertical conductive structure 185 is removed, an upper portion of the contact separation pattern 137 may be relatively enlarged. Therefore, in a semiconductor device, which may be highly integrated, process difficulty for formation of the second contact plug 172 connected to the source/drain regions 150 while ensuring electrical isolation from the first contact plug 171 and the vertical conductive structure 185 may be improved. Also, as a portion of an upper end of the vertical conductive structure 185 is selectively removed, inner and outer side surfaces of a partial region of the gate separation pattern 135 may be exposed together to improve process difficulty for formation of the first contact plug 171. This may be because the gate separation pattern 135 may be relatively easily removed by disposing the gap-fill insulating layer 190' including a material having a relatively high etching rate, instead of the vertical conductive structure 185, on the inner side surface of the gate separation pattern 135. Therefore, a semiconductor device 100 having improved electrical characteristics by relatively increasing a contact area between the vertical conductive structure 185 and the first contact plug 171 may be provided.

The upper surface of the contact separation pattern 137 may be coplanar or substantially coplanar with upper surfaces of the contact plugs 170. A height level of the lower surface of the contact separation pattern 137 may be located to be lower than a height level of an upper surface of the gate structure 160. In some example embodiments, a height level of a lower end of the contact separation pattern 137 may be located to be higher than height levels of lower ends of the contact plugs 170.

In some example embodiments, a flat area of an upper portion of the contact separation pattern 137 may be smaller than a flat area of a lower portion of the contact separation pattern 137. The upper portion of the contact separation pattern 137 may refer to a portion located on a higher height level than the lower portion of the contact separation pattern 137. In the second horizontal direction, for example, in the Y-direction, a width of the upper portion of the contact separation pattern 137 may be greater than a width of the lower portion of the contact separation pattern 137. This may be because a portion of the upper portion of the contact separation pattern 137 may be removed in an etching process performed after forming the contact separation pattern 137. The etching process may be a process for forming openings for forming the contact plugs 170.

The contact separation pattern 137 may include at least one of silicon nitride, silicon carbonitride, or silicon oxynitride.

Figure 3:
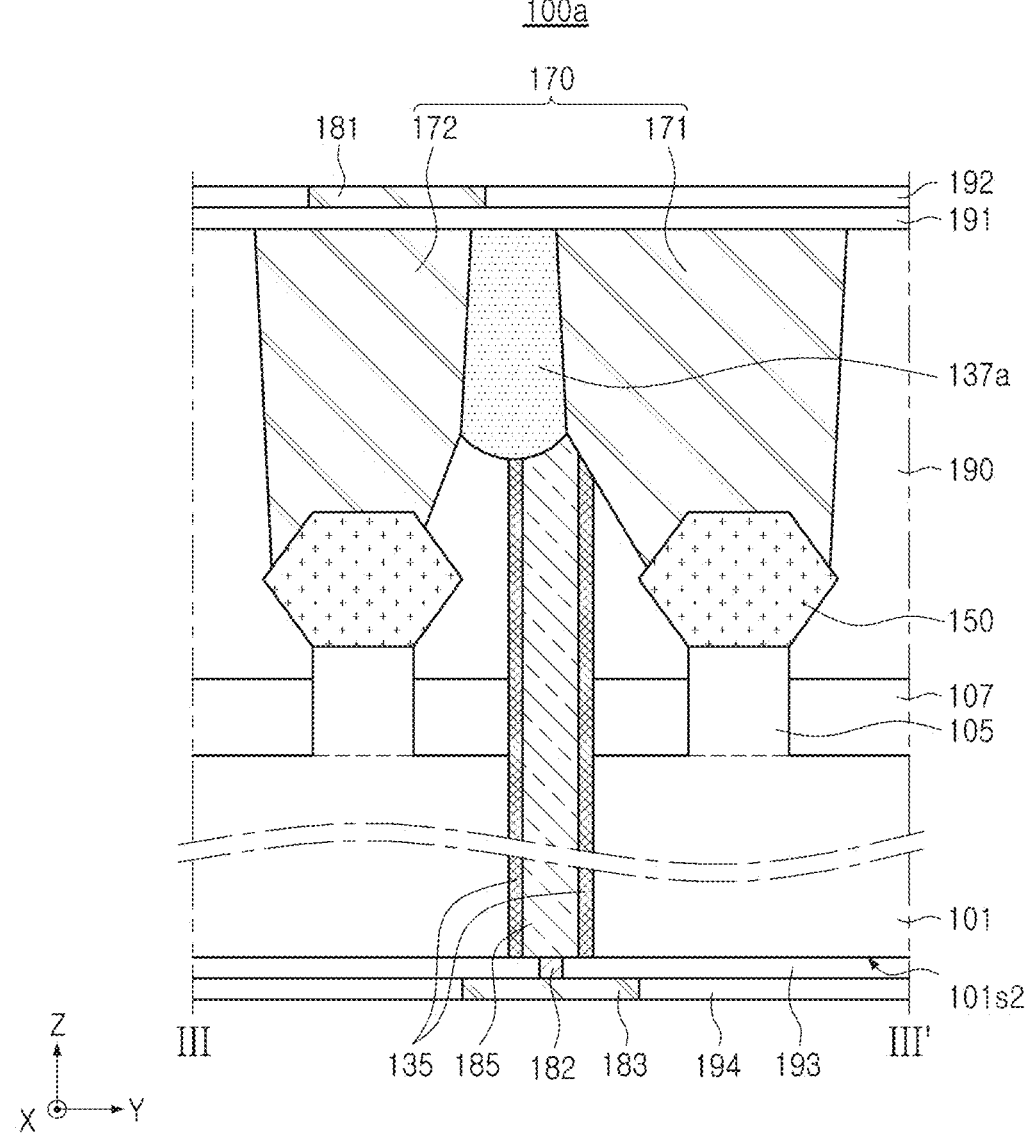
FIG. 3 is a cross-sectional view illustrating a semiconductor device according to some example embodiments.

FIG. 3 is a cross-sectional view illustrating a semiconductor device according to some example embodiments. FIG. 3 illustrates a region corresponding to a cross-section, taken along line of FIG. 1.

Referring to FIG. 3, in a semiconductor device 100a, a lower surface of a contact separation pattern 137a may have a downwardly convex shape. A portion of an upper surface of a vertical conductive structure 185 and a portion of an upper surface of a gate separation pattern 135 may be coplanar or substantially coplanar according to the convex shape.

Figure 4:
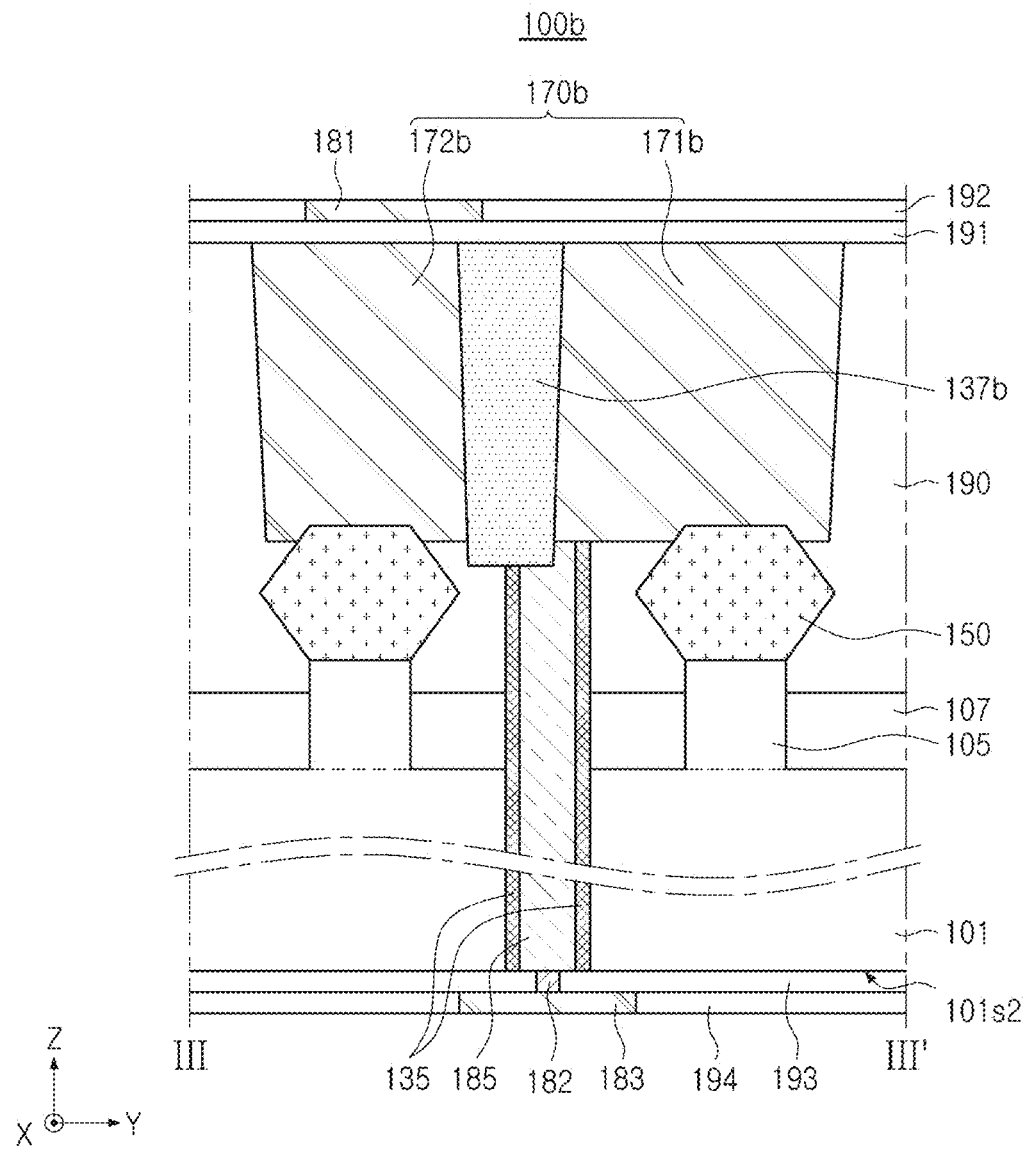
FIG. 4 is a cross-sectional view illustrating a semiconductor device according to some example embodiments.

FIG. 4 is a cross-sectional view illustrating a semiconductor device according to some example embodiments. FIG. 4 illustrates a region corresponding to a cross-section, taken along line of FIG. 1.

Referring to FIG. 4, in a semiconductor device 100b, a contact separation pattern 137b may pass through contact plugs 170b, and a height level of a lower end of the contact separation pattern 137b may be located to be lower than height levels of lower ends of the contact plugs 170b. The lower end of the contact separation pattern 137b may be located on a height level, lower than upper ends of source/drain regions 150. An upper surface of the contact separation pattern 137b may be coplanar or substantially coplanar with upper surfaces of the contact plugs 170b.

This may be because the contact separation pattern 137b separating first and second contact plugs 171b and 172b may be formed after the contact plugs 170b are formed. Even in this case, the first contact plugs 171b may be connected to a vertical conductive structure 185, and the second contact plugs 172b may be insulated from the vertical conductive structure 185.

According to some example embodiments, by first forming a contact plug contacting the vertical conductive structure 185 on the vertical conductive structure 185, a contact area between the first contact plug 171b and the vertical conductive structure 185 may be secured to provide a semiconductor device having improved electrical characteristics. In addition, in a subsequent etching process for forming the contact separation pattern 137b, a process condition may be adjusted according to a relatively small number of materials (e.g., considering only a material of a contact plug 170' (the contact plug 170' being discussed below in relation to FIGS. 15 and 16), while not considering a material of, for example, the gate separation pattern 135 or the vertical conductive structure 185), to provide a semiconductor device having improved process difficulty.

Figure 5:
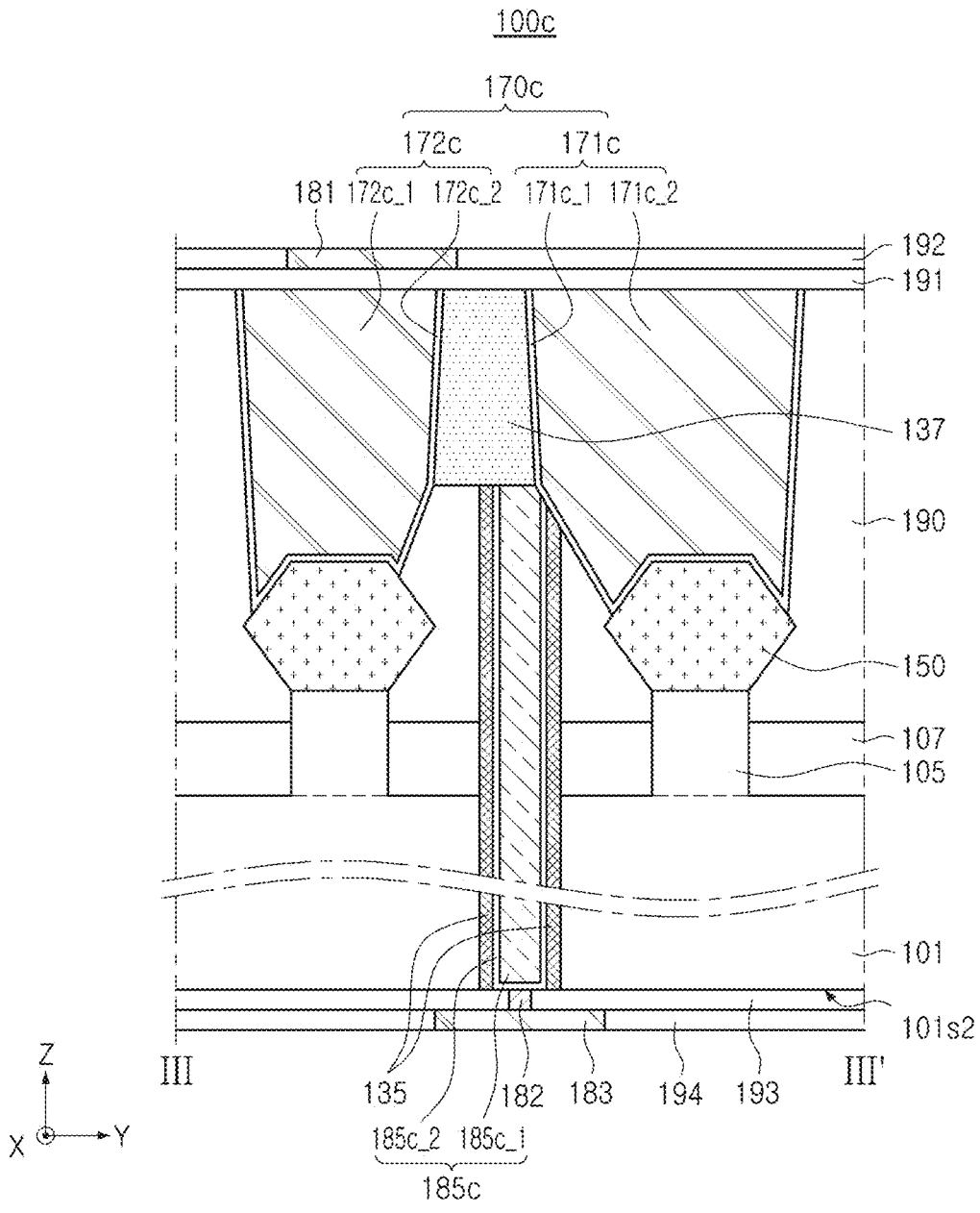
FIG. 5 is a cross-sectional view illustrating a semiconductor device according to some example embodiments.

FIG. 5 is a cross-sectional view illustrating a semiconductor device according to some example embodiments. FIG. 5 illustrates a region corresponding to a cross-section, taken along line of FIG. 1.

Referring to FIG. 5, in a semiconductor device 100*c*, a first contact plug 171*c* may include a plug layer 171*c*\_1 and a barrier layer 171*c*\_2. The plug layer 171*c*\_1 may be, for example, a metal nitride such as a titanium nitride film (TiN), a tantalum nitride film (TaN), or a tungsten nitride film (WN), and/or a metal material such as aluminum (Al), tungsten (W), molybdenum (Mo), or the like. The barrier layer 171*c*\_2 may conformally cover side and bottom surfaces of the plug layer 171*c*\_1. The barrier layer 171*c*\_2 may include, for example, a metal nitride such as a titanium nitride film (TiN), a tantalum nitride film (TaN), or a tungsten nitride film (WN).

A second contact plug 172*c* may include a plug layer 172*c*\_1 and a barrier layer 172*c*\_2, and may have the same or similar characteristics as the plug layer 171*c*\_1 and the barrier layer 171*c*\_2 of the first contact plug 171*c*.

In some example embodiments, a vertical conductive structure 185*c* may include a plug layer 185*c*\_1 and a barrier layer 185*c*\_2. The barrier layer 185*c*\_2 of the vertical conductive structure 185*c* may conformally cover side and bottom surfaces of the plug layer 185*c*\_1. In some example embodiments, the barrier layer 171*c*\_2 of the first contact plug 171*c* may be in contact with the plug layer 185*c*\_1 and the barrier layer 185*c*\_2 of the vertical conductive structure 185*c*, or, alternatively, may be in contact with only the barrier layer 185*c*\_2 of the vertical conductive structure 185*c*.

In addition, according to some example embodiments, shapes of the vertical conductive structure 185*c* and the contact plugs 170*c* may be variously changed, e.g., only one structure among the vertical conductive structure 185*c* and the contact plugs 170*c* may include a plug layer and a barrier layer.

Figure 6:
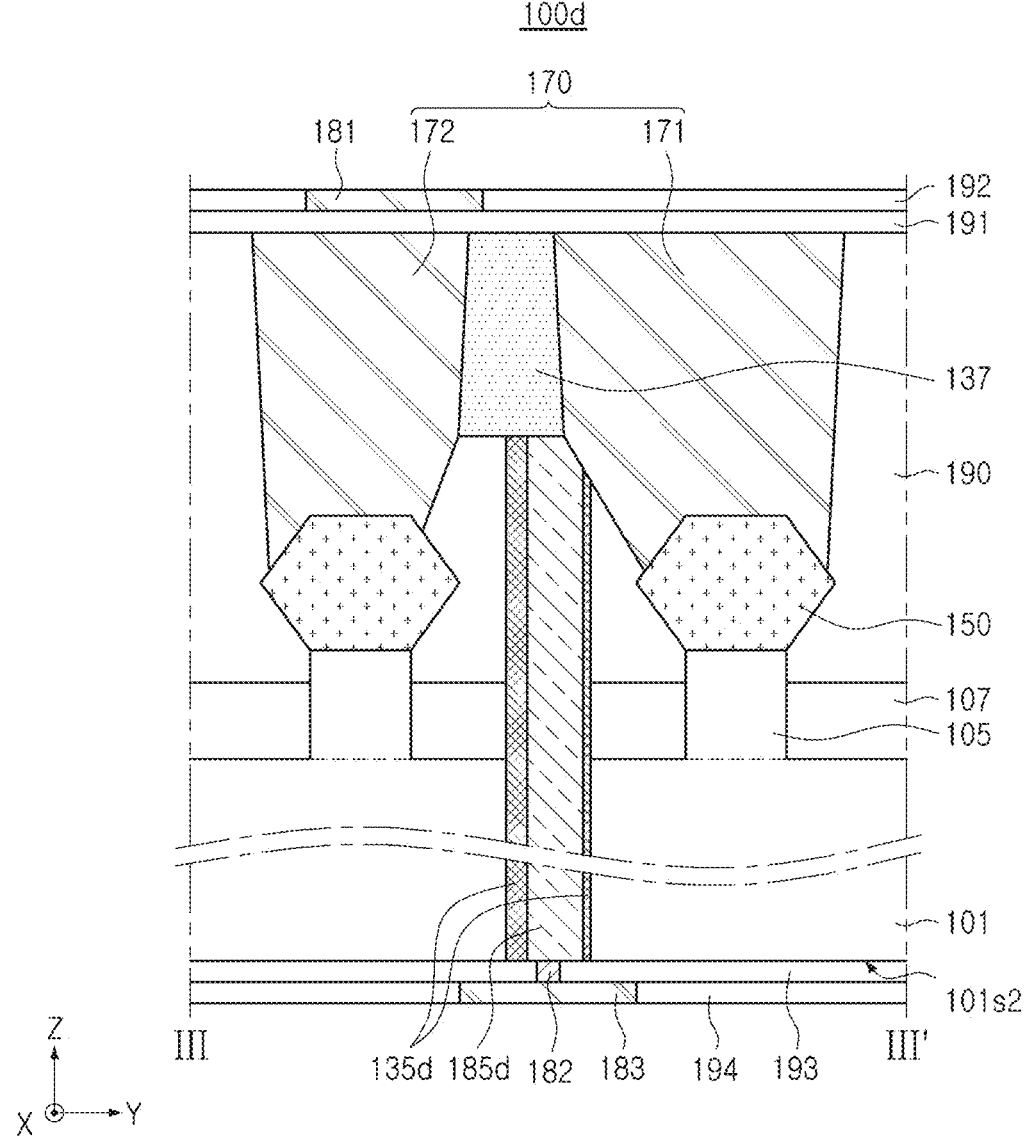
FIG. 6 is a cross-sectional view illustrating a semiconductor device according to some example embodiments.

FIG. 6 is a cross-sectional view illustrating a semiconductor device according to some example embodiments. FIG. 6 illustrates a region corresponding to a cross-section, taken along line of FIG. 1.

Referring to FIG. 6, a gate separation pattern 135*d* in a semiconductor device 100*d* may have a non-uniform thickness on an outer side surface of a vertical conductive structure 185*d*. This may be because, a second opening, may be misaligned, which is formed after forming a first opening, filling an insulating material, and partially removing the insulating material from the first opening, in an etching process for forming the second opening. The first opening may be an opening corresponding to the gate separation pattern 135*d* and the vertical conductive structure 185*d*, and the second opening may be an opening for forming the vertical conductive structure 185*d*.

Figure 7:
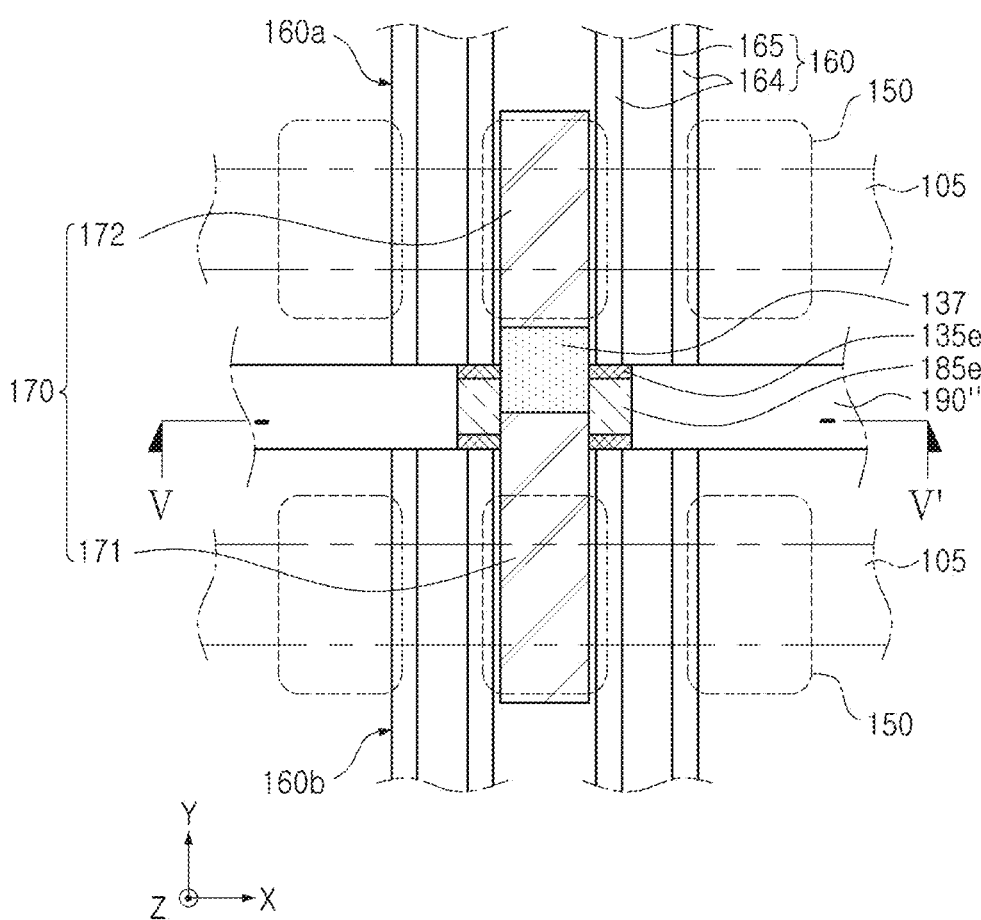
FIG. 7 is a plan view illustrating a semiconductor device according to example embodiments.

FIG. 7 is a plan view illustrating a semiconductor device according to example embodiments.

Figure 8A:
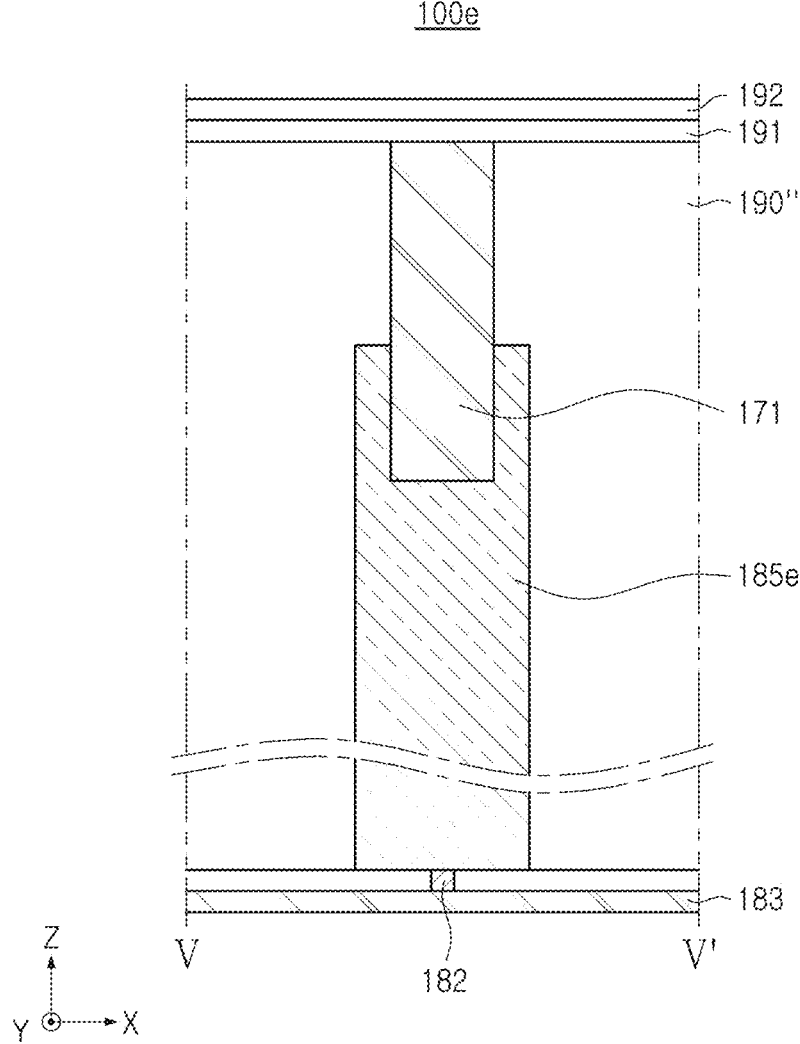
FIGS. 8A, 8B, and 8C are cross-sectional views illustrating a semiconductor device according to example embodiments.

FIG. 8A is a cross-sectional view illustrating a semiconductor device according to example embodiments. FIG. 8A illustrates a region of cross-section, taken along line V-V' of FIG. 7.

Referring to FIGS. 7 and 8A, in a semiconductor device 100*e*, a vertical conductive structure 185*e* may be disposed between active regions 105, and may be disposed between first and second contact plugs 171 and 172, in plan view.

In some example embodiments, the vertical conductive structure 185*e* may have a hole type such as a polygon such as a quadrangle or the like, a polygon with rounded corners, or the like, and a gap-fill insulating layer 190" may be disposed on both sides of the vertical conductive structure 185*e* the first horizontal direction, for example, the X-direction. The gap-fill insulating layer 190" may penetrate a substrate 101, and may be in contact with a first lower insulating layer 193. This may be because, unlike the semiconductor device 100 of FIGS. 1 to 2D, after the vertical conductive structure 185*e*, having a linear type, is formed, a separate opening may be formed, and the gap-fill insulating layer 190" may be filled in the opening. Therefore, a semiconductor device having improved electrical characteristics such as reducing parasitic capacitance between the vertical conductive structure 185*e* and a gate structure 160 may be provided. In some example embodiments, the gap-fill insulating layer 190" may serve to separate first and second gate structures 160*a* and 160*b*. The gap-fill insulating layer 190" may include at least one of silicon oxide, silicon nitride, or silicon oxynitride, and may be formed as multiple layers.

According to some example embodiments, the vertical conductive structure 185*e* may have a hole type such as a polygon such as a quadrangle or the like, a polygon with rounded corners, an oval, a circle, or the like, and the gap-fill insulating layer 190" may be arranged to surround a side surface of the vertical conductive structure 185*e*. This may be because the vertical conductive structure 185*e* may be prepared by forming an insulating material layer having a conformal thickness on a side wall of a hole-type opening, instead of a linear type opening, and then filling a conductive material therein.

In some example embodiments, the vertical conductive structure 185*e* may have an upper surface having a lower height level than upper surfaces of contact plugs 170 or an upper surface of the gate structure 160, like the vertical conductive structure 185 of FIGS. 2A to 2D, or, alternatively, may have an upper surface having the same or substantially the same height level as the upper surfaces of the contact plugs 170 or the upper surface of the gate structure 160, according to some example embodiments. This may be a structure formed by omitting a process of removing a portion of an upper end of the vertical conductive structure 185*e* and performing a process of removing side portions of both sides of the vertical conductive structure 185*e* in the first horizontal direction.

Figure 8B:
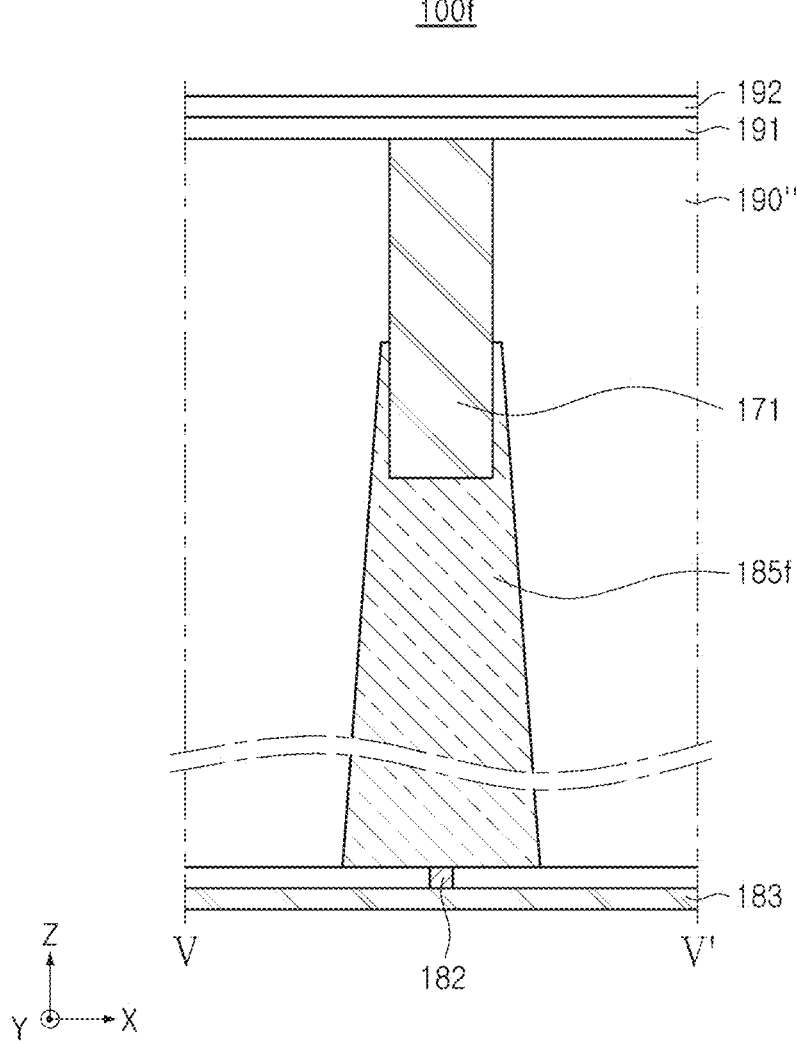

FIG. 8B is a cross-sectional view illustrating a semiconductor device according to example embodiments. FIG. 8B illustrates a region corresponding to a cross-section, taken along line V-V' of FIG. 7.

Referring to FIG. 8B, in a semiconductor device 100*f*, a vertical conductive structure 185*f* has an inclined side surface of which width increases toward lower interconnection lines 183 in the first horizontal direction, for example, the X-direction. This may be a structure formed by forming a conductive layer extending in the X-direction and then removing a portion of the conductive layer in an etching process.

Figure 8C:
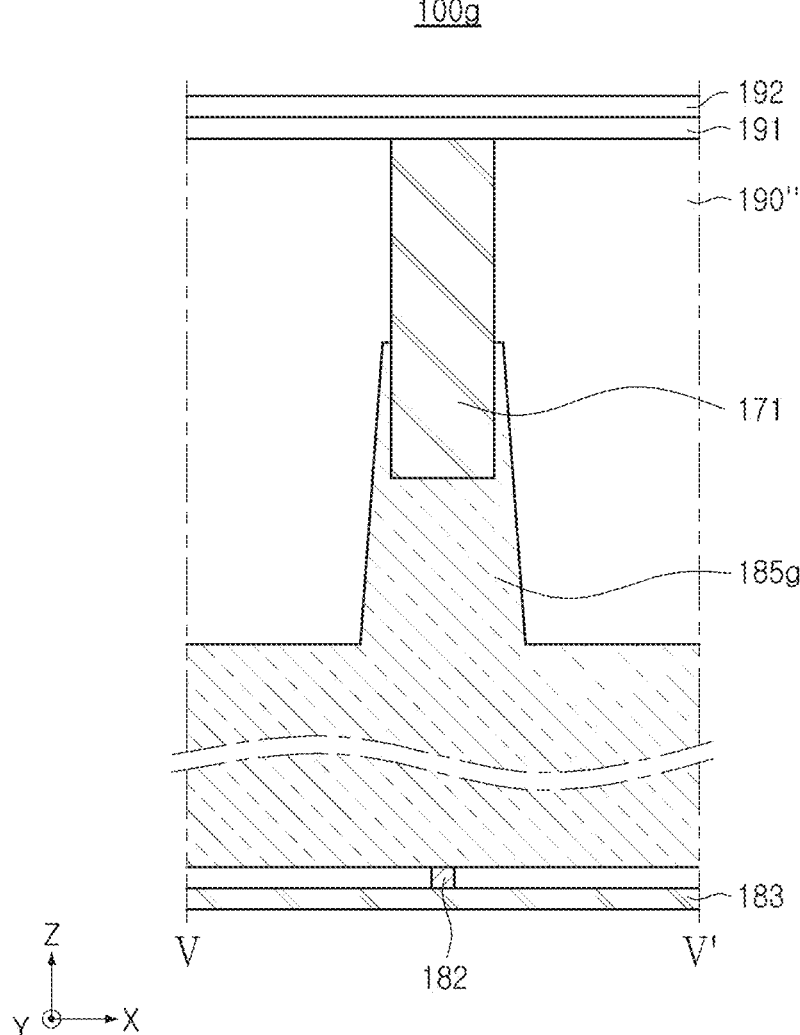

FIG. 8C is a cross-sectional view illustrating a semiconductor device according to example embodiments. FIG. 8C illustrates a region corresponding to a cross-section, taken along line V-V' of FIG. 7.

Referring to FIG. 8C, in a semiconductor device 100*g*, a lower surface of a gap-fill insulating layer 190" may be spaced apart from lower insulating layers 193 and 194 to contact a vertical conductive structure 185*g*. For example, the vertical conductive structure 185*g* may include a vertically extending portion and a horizontally extending portion connected to the vertically extending portion on a lower end thereof. This may be a structure formed by retaining a portion of a lower end portion of the vertical conductive structure 185*g* in a process of forming an opening for forming the gap-fill insulating layer 190".

FIGS. 9 to 14 are views illustrated in process order to illustrate a method of manufacturing a semiconductor device according to example embodiments. FIGS. 9 to 14 illustrate some example embodiments of a method of manufacturing the semiconductor device 100 of FIGS. 1 to 2D.

Figure 9:
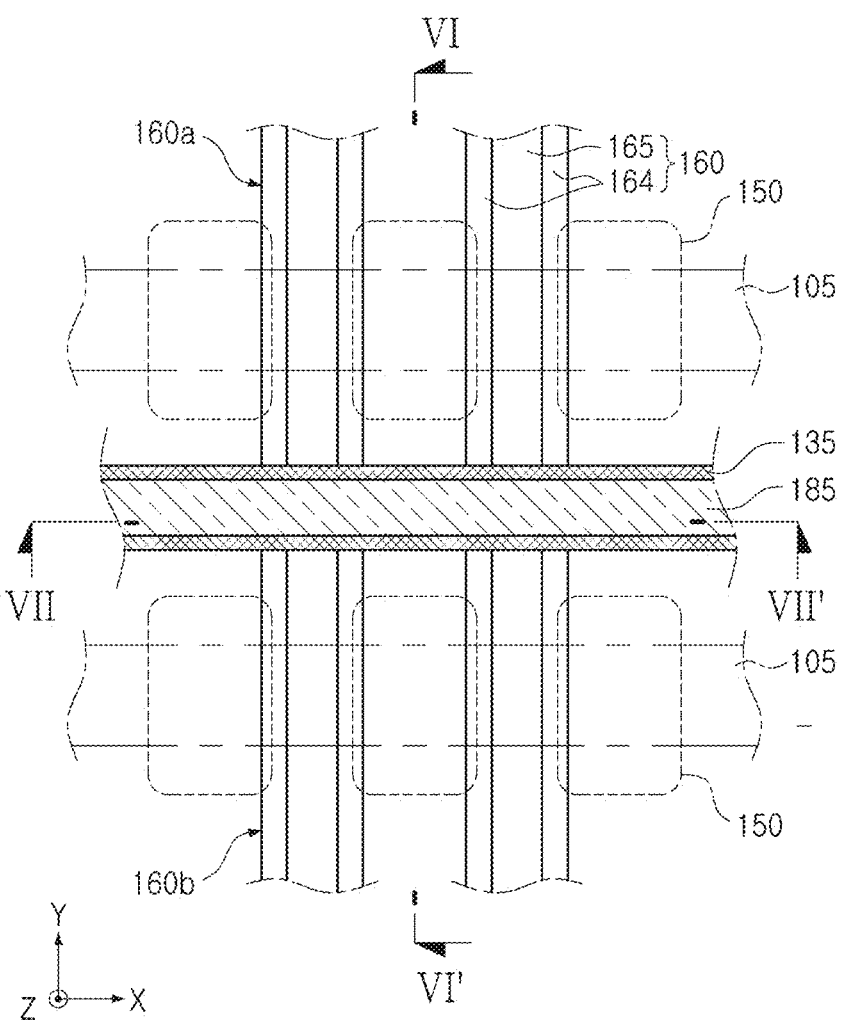
FIGS. 9, 10A, 10B, 11A, 11B, 12, 13, 14A, and 14B are views illustrated in process order to illustrate a method of manufacturing a semiconductor device according to example embodiments.
Figure 10A:
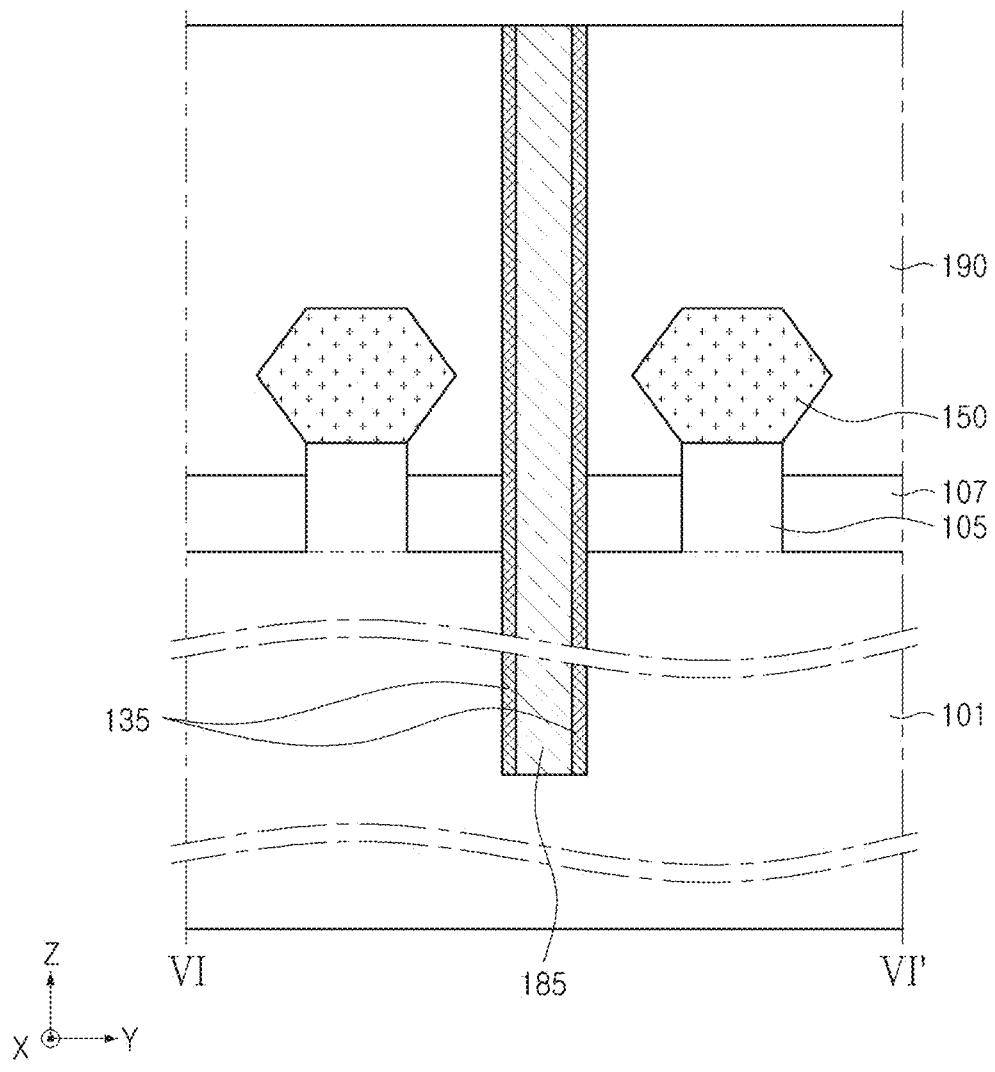
Figure 10B:
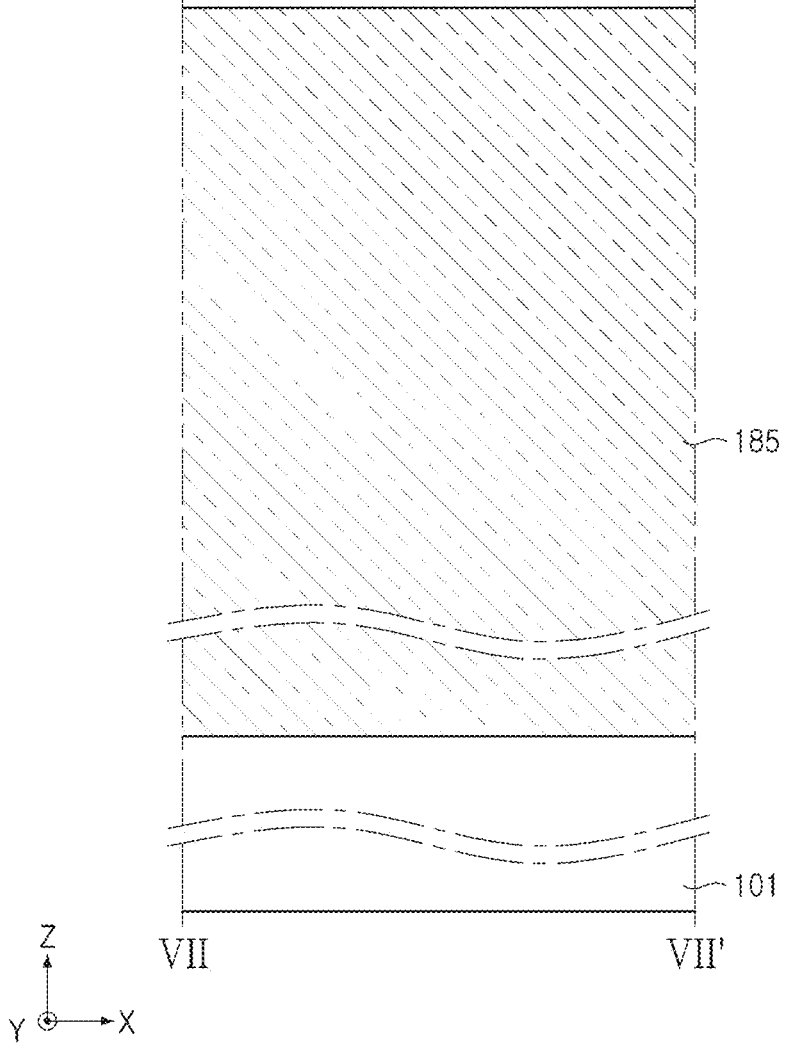
Figure 11A:
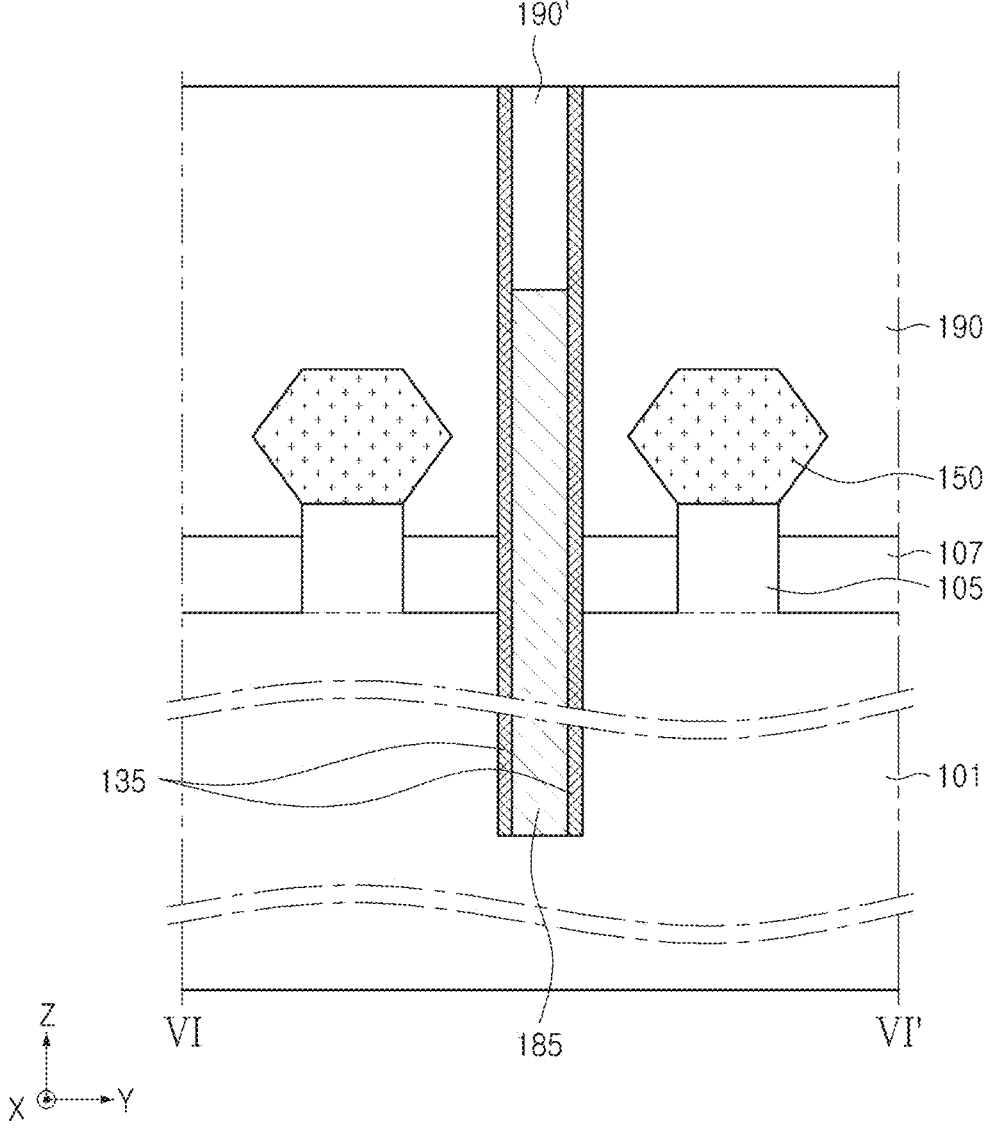
Figure 11B:
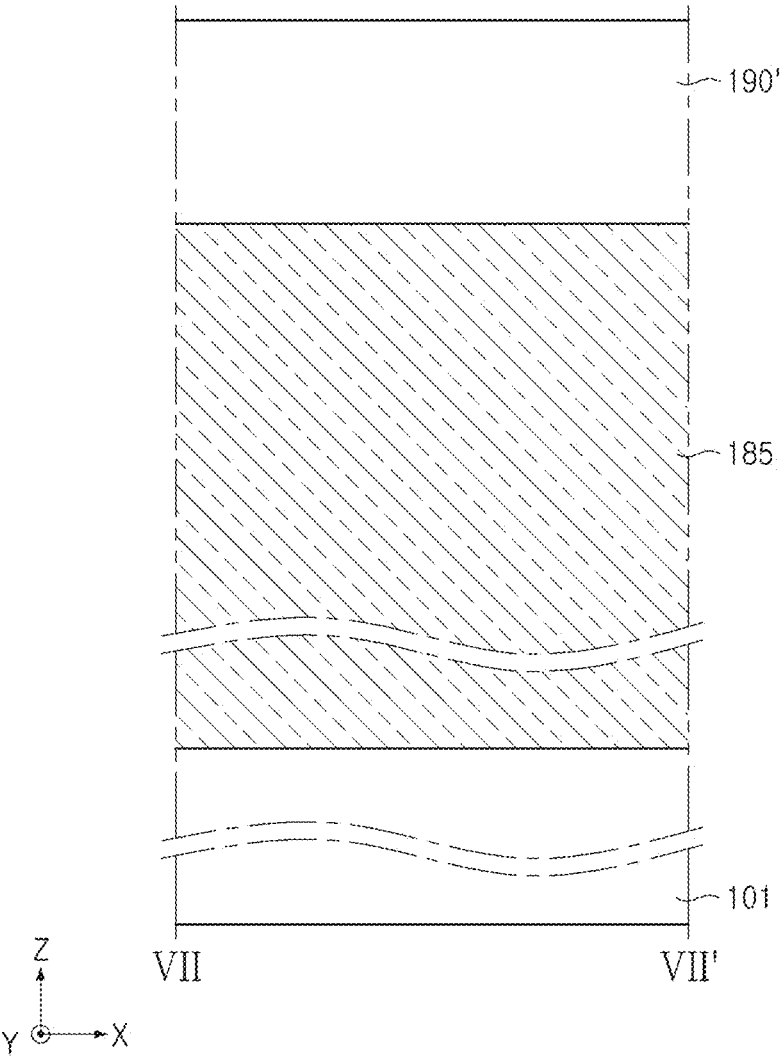
Figure 12:
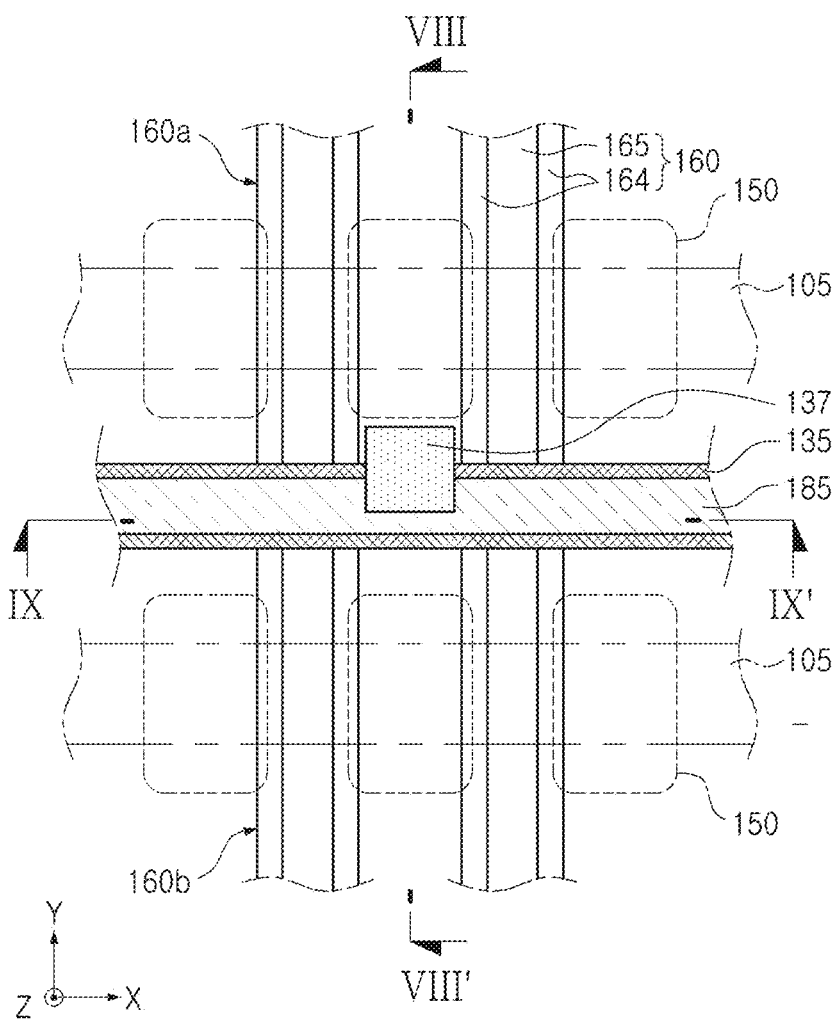
Figure 13:
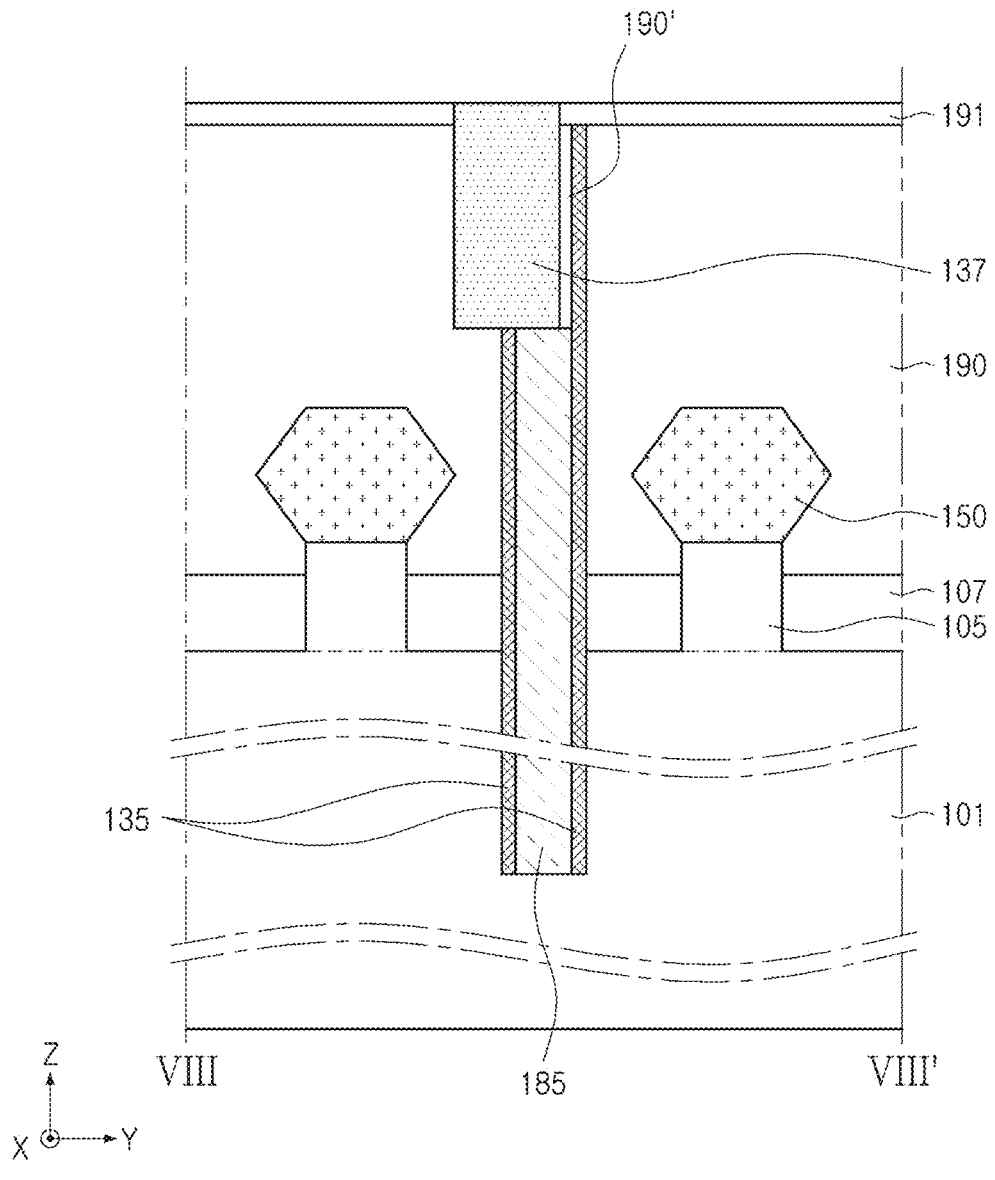
Figure 14A:
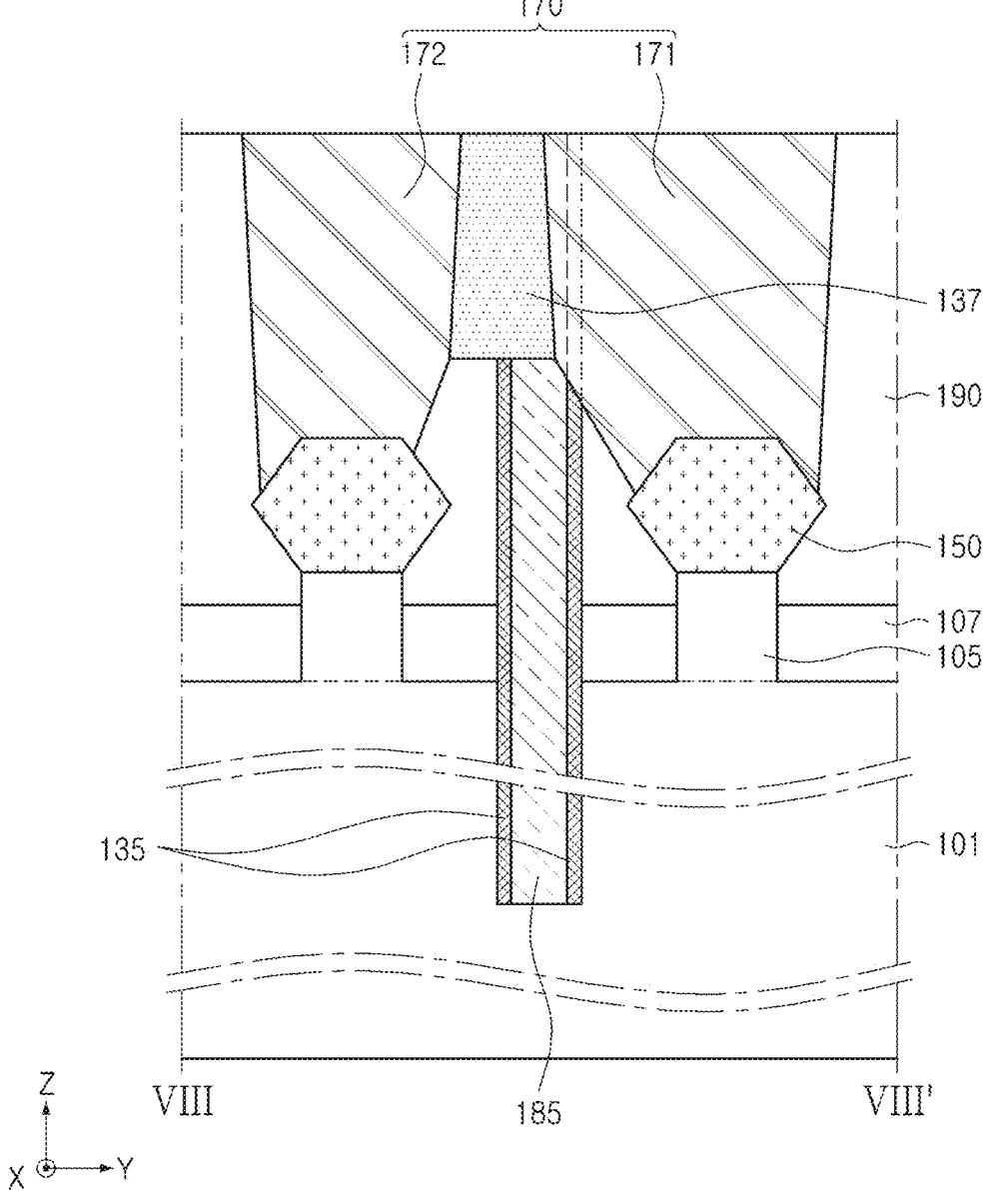
Figure 14B:
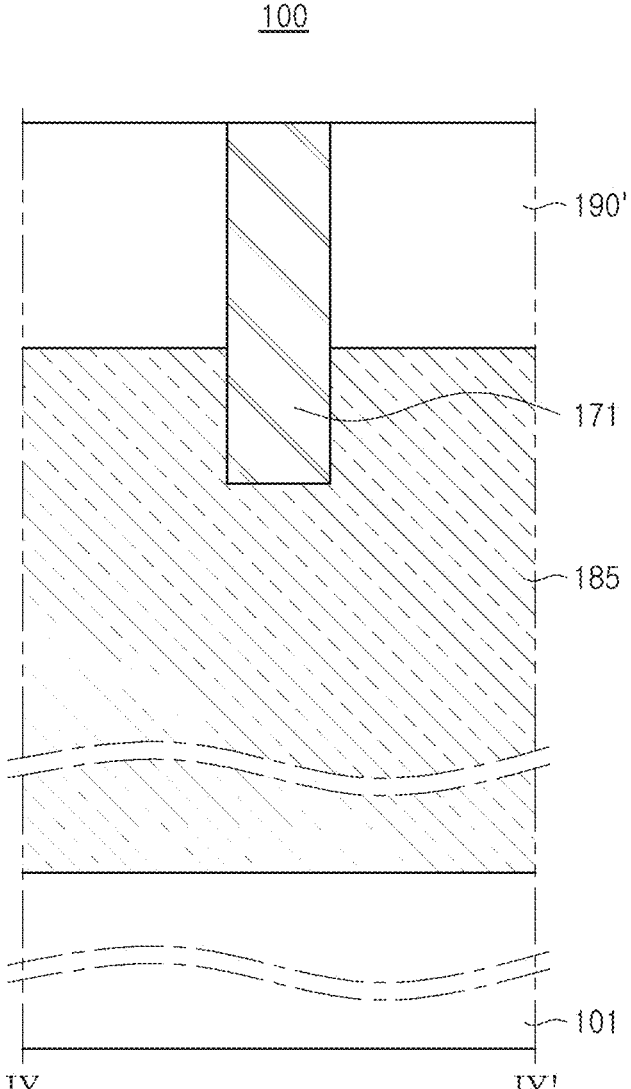

FIGS. 9 and 12 are plan views sequentially illustrating a method of manufacturing a semiconductor device according to example embodiments of the present inventive concepts, FIGS. 10A and 11A are cross-sectional views illustrating a region, taken along line VI-VI' of FIG. 9, FIGS. 10B and 11B are cross-sectional views illustrating a region, taken along line VII-VII' of FIG. 9, FIGS. 13 and 14A are cross-sectional views illustrating a region, taken along line VIII-VIII' of FIG. 12, and FIG. 14B is a cross-sectional view illustrating a region, taken along line IX-IX' of FIG. 12.

Referring to FIGS. 9, 10A, and 10B, active regions 105 and channel layers 140 (see FIG. 2A) may be formed on a substrate 101, and a gate structure 160 intersecting the active regions 105 on the substrate 101, and source/drain regions 150 contacting the channel layers 140 may be formed, and a vertical conductive structure 185 may be formed.

Sacrificial layers and the channel layers 140, alternately stacked, may be formed on the substrate 101, and at least a portion of the alternately stacked sacrificial layers and channel layers 140, and at least a portion of the substrate 101 may be etched to form a trench defining the active regions 105, to form active structures. The active structures may include the active regions 105 and the sacrificial layers and channel layers 140, alternately stacked on the active regions 105. The sacrificial layers may be replaced by a gate dielectric layer 162 and a gate electrode 165, as illustrated in FIG. 2A, by a subsequent process. The sacrificial layers may be formed of a material having etch selectivity with respect to the channel layers 140. The sacrificial layers may include, for example, silicon germanium (SiGe), and the channel layers 140 may include silicon (Si).

The active regions 105 may be regions defined by the trench. The active regions 105 may be regions formed to protrude from an upper surface of the substrate 101 by removing a portion of the substrate 101. The active regions 105 may have a shape protruding from the upper surface of the substrate 101 in the Z-direction, which may be a direction, perpendicular to the upper surface of the substrate 101, and may be formed of the same material as the substrate 101. The active regions 105 may be formed to have a linear shape extending in one direction, for example, the X-direction, and may be disposed to be spaced apart from each other in the Y-direction.

In a region from which the portion of the substrate 101 is removed, a device isolation layers 107 may be formed by burying an insulating material and then partially removing the insulating material such that the active regions 105 protrude. The device isolation layers 107 may be formed to partially cover side surfaces of the active regions 105. Upper surfaces of the device isolation layers 107 may be formed to be lower than upper surfaces of the active regions 105. The device isolation layers 107 may include silicon oxide.

Next, sacrificial gate structures traversing the active regions 105, and channel structures 140 and parallel to each other may be formed. Each of the sacrificial gate structures may have a linear shape extending in one direction, for example, a Y-direction. In some example embodiments, each of the sacrificial gate structures may include a sacrificial gate insulating layer, a sacrificial gate layer, and a sacrificial gate capping layer, stacked in sequence, wherein the sacrificial gate layer may include, for example, polysilicon, and the sacrificial gate capping layer may include, for example, silicon nitride. The number of layers and materials of the sacrificial gate structures may be variously changed according to some example embodiments.

Next, gate spacers 164 may be formed on both side walls of the sacrificial gate structures. The gate spacer 164 may include an insulating material, and may include, for example, at least one of SiO, SiN, SiCN, SiOC, SiON, or SiOCN.

Next, the exposed sacrificial layers and the channel layers 140 may be removed between the sacrificial gate structures, to form a recess portion and expose the active regions 105. A portion of the substrate 101 may be recessed by forming the recess portion to be relatively deep, but the present inventive concepts are not limited thereto, and may be recessed such that a lower surface of the recess portion contacts the substrate 101. By performing an epitaxial growth process in the recess portion, the source/drain regions 150 disposed on at least one side of the sacrificial gate structures and the gate spacer 164 and disposed on the active regions 105 may be formed. The source/drain regions 150 are illustrated as one layer, but may be formed as a plurality of layers having different materials by a plurality of epitaxial growth processes or the like.

Next, an insulating material may be filled to cover the sacrificial gate structures, the gate spacers 164, the source drain regions 150, and the device isolation layers 107, and a planarization process may be performed to form an intermediate insulating layer 190. The insulating material may be formed of an oxide, a nitride, an oxynitride, and/or a low-κ material.

Next, gate structures 160 may be formed by removing the sacrificial gate structures and forming a gate dielectric layer 162 (refer to FIG. 2A), a gate electrode 165 (refer to FIG. 2A), and a gate capping layer 166 (refer to FIG. 2A).

A gate separation pattern 135 may be formed between first and second gate structures 160a and 160b opposing each other in the second horizontal direction, for example, the Y-direction. The gate separation pattern 135 may be formed by forming an opening passing through the intermediate insulating layer 190 and the device isolation layers 107 between the first and second gate structures 160a and 160b and extending into the substrate 101, and, filling the opening with an insulating material. The insulating material may include, for example, silicon nitride. The gate separation pattern 135 may be formed after forming the gate structures 160, but may be formed after forming the sacrificial gate structure and before forming the gate structures 160, according to some example embodiments.

In some example embodiments, an insulating material may be conformally formed in the opening and the insulating material formed on a bottom surface of the opening may be removed to form the gate separation pattern 135, and then the opening may be filled with a conductive material and a planarization process may be performed to form the vertical conductive structure 185. The conductive material may include a metal material such as aluminum (Al), tungsten (W), molybdenum (Mo), or the like, or a semiconductor material such as doped polysilicon, or a combination thereof. Therefore, an outer side surface of the vertical conductive structure 185 may be surrounded by the gate separation pattern 135, and the gate separation pattern 135 may have a uniform thickness on the outer side surface of the vertical conductive structure 185.

According to some example embodiments, the insulating material may be filled in the opening and an etching process of removing a portion of the insulating material may be additionally performed, to form a separate opening in the opening, and then, the conductive material may be filled in the separate opening to form the vertical conductive structure 185. In this case, the gate separation pattern 135 may have a non-uniform thickness, depending on a process condition of the etching process additionally performed.

Referring to FIGS. 11A and 11B, a gap-fill insulating layer 190' may be formed.

A trench may be formed by performing an etching process of removing a portion of an upper end of the vertical conductive structure 185. The etching process may be a process of selectively removing the vertical conductive structure 185 with respect to the gate separation pattern 135. Therefore, the trench may be defined as an upper surface of the vertical conductive structure 185 from which an inner side surface of the gate separation pattern 135 and the portion of the upper end are removed.

An insulating material may be filled in the trench and a planarization process may be performed, to form the gap-fill insulating layer 190'. In some example embodiments, the gap-fill insulating layer 190' may include the same material as the intermediate insulating layer 190. The insulating material may include, for example, silicon oxide.

Referring to FIGS. 12 and 13, a contact separation pattern 137 may be formed.

First, a first upper insulating layer 191 may be formed on the intermediate insulating layer 190, and the first upper insulating layer 191, a portion of the gate separation pattern 135, and a portion of the gap-fill insulating layer 190' may be removed to form an opening, an insulating material may be filled in the opening, and a planarization process may be performed, to form the contact separation pattern 137. In this operation, a process of forming the first upper insulating layer 191 may be omitted. The opening may expose a portion of an upper surface of the vertical conductive structure 185. The opening may be formed to offset from a central axis of the vertical conductive structure 185 in the X-direction, in the Y-direction by a predetermined (e.g., alternatively, desired) distance, and may not completely overlap the vertical conductive structure 185 in the Z-direction. Therefore, the portion of the upper surface of the vertical conductive structure 185 may be exposed by the opening, and a remaining portion thereof may be covered by the gap-fill insulating layer 190'. The insulating material may include at least one of silicon nitride, silicon oxynitride, or silicon carbonitride. In some example embodiments, the contact separation pattern 137 may include the same material as the gate separation pattern 135.

Referring to FIGS. 14A and 14B, contact plugs 170 may be formed.

A portion of the intermediate insulating layer 190 may be removed by an etching process, first and second openings exposing a portion of an upper surface of the source/drain regions 150 may be formed, and a conductive material may be filled in the first and second openings, and a planarization process may be performed to form the contact plugs 170 including first and second contact plugs 171 and 172. The first and second openings may be formed in the same etching process, but may be physically separated from each other by the contact separation pattern 137.

The first opening may be formed by removing the gap-fill insulating layer 190', the gate separation pattern 135, and the intermediate insulating layer 190. The gate separation pattern 135 may be relatively easily removed by removing a portion of an upper end of the vertical conductive structure 185 and filling the gap-fill insulating layer 190' including a material having an etching rate, faster than an etching rate of the vertical conductive structure 185 under specific process conditions. Therefore, an area of the vertical conductive structure 185 exposed by the first opening or a contact area between the first contact plug 171 and the vertical conductive structure 185 formed in the first opening may be relatively increased.

The second opening may be formed by removing the intermediate insulating layer 190. As the portion of the upper end of the vertical conductive structure 185 is removed, an average width of the contact separation pattern 137 in the Y-direction may increase. Therefore, insulating ability of the contact separation pattern 137 (e.g., insulating ability between the second contact plug 172 and the vertical conductive structure 185) may be increased. For example, process difficulty for forming the second opening exposing the source/drain regions 150 while being separated from the vertical conductive structure 185 may be improved.

Therefore, a semiconductor device 100 having improved electrical characteristics and productivity may be provided.

In some example embodiments, a portion of an upper end of the contact separation pattern 137 may be removed in the etching process for forming the first and second openings. Therefore, a flat area of an upper portion of the contact separation pattern 137 may be smaller than a flat area of a lower portion of the contact separation pattern 137.

Next, referring to FIGS. 1 to 2D, first and second upper insulating layers 191 and 192 and an upper interconnection structure 181 may be formed, and the substrate 101 may be partially removed from a rear surface by a grinding process, to expose the gate separation pattern 135 and the vertical conductive structure 185, and lower insulating layers 193 and 194 and the lower interconnection structures 182 and 183 may be formed, to form a semiconductor device 100.

Figure 15:
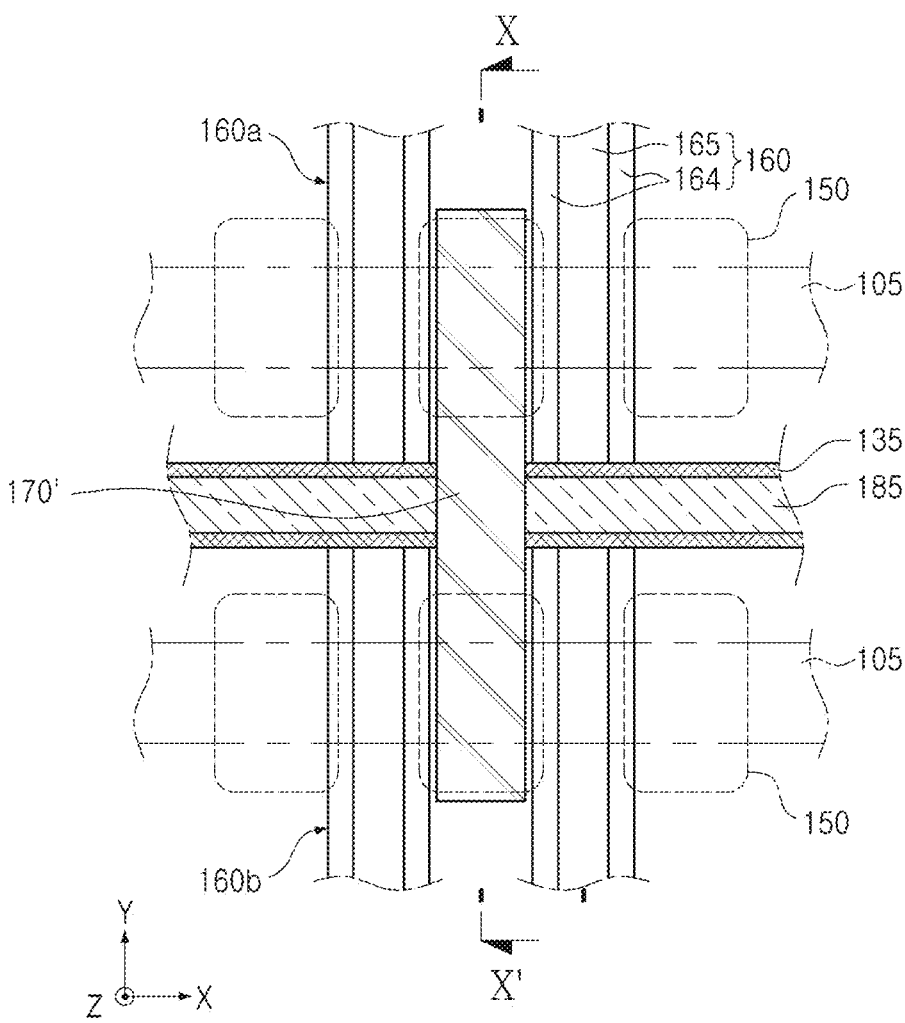
FIGS. 15, 16, and 17 are views illustrated in process order to illustrate a method of manufacturing a semiconductor device according to example embodiments.
Figure 16:
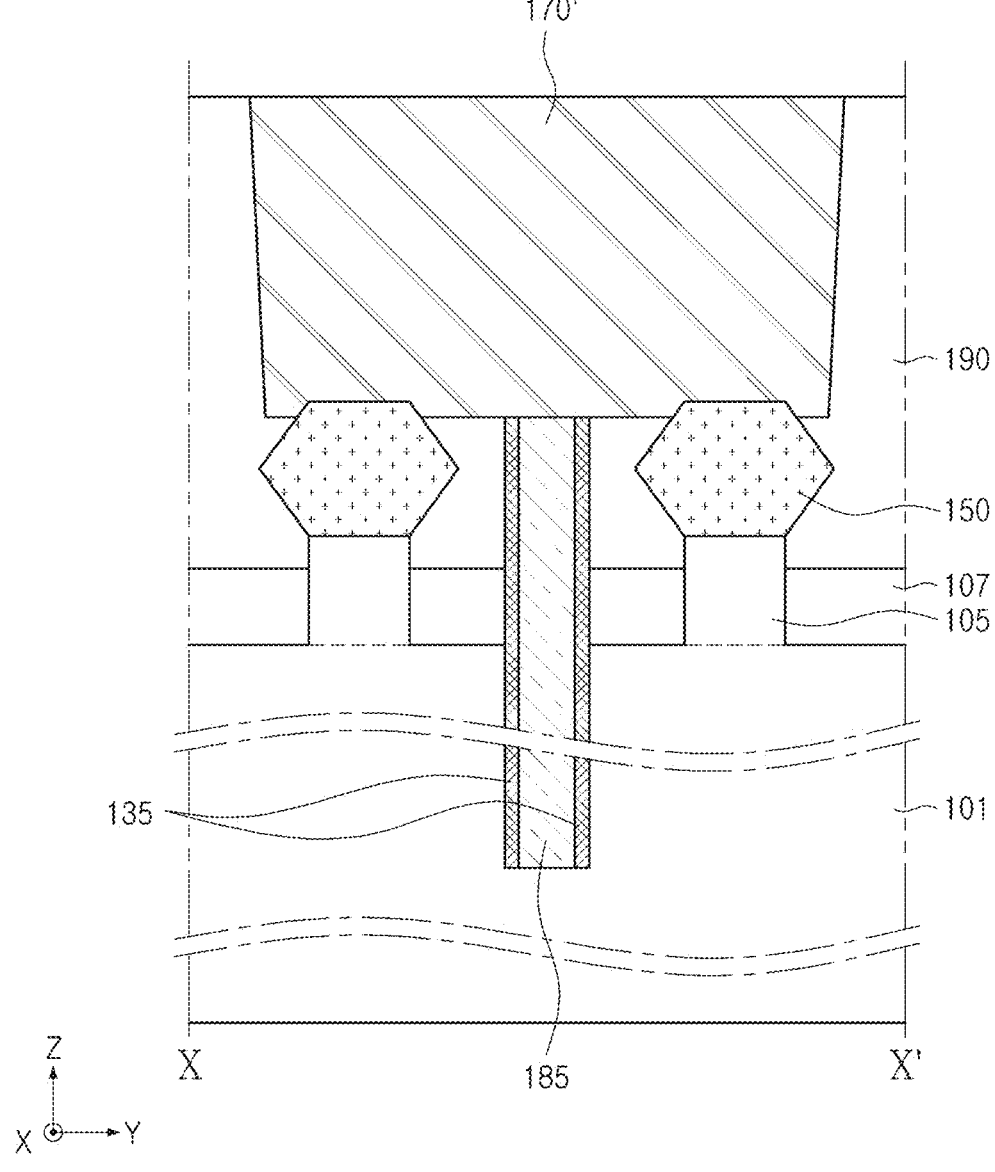
Figure 17:
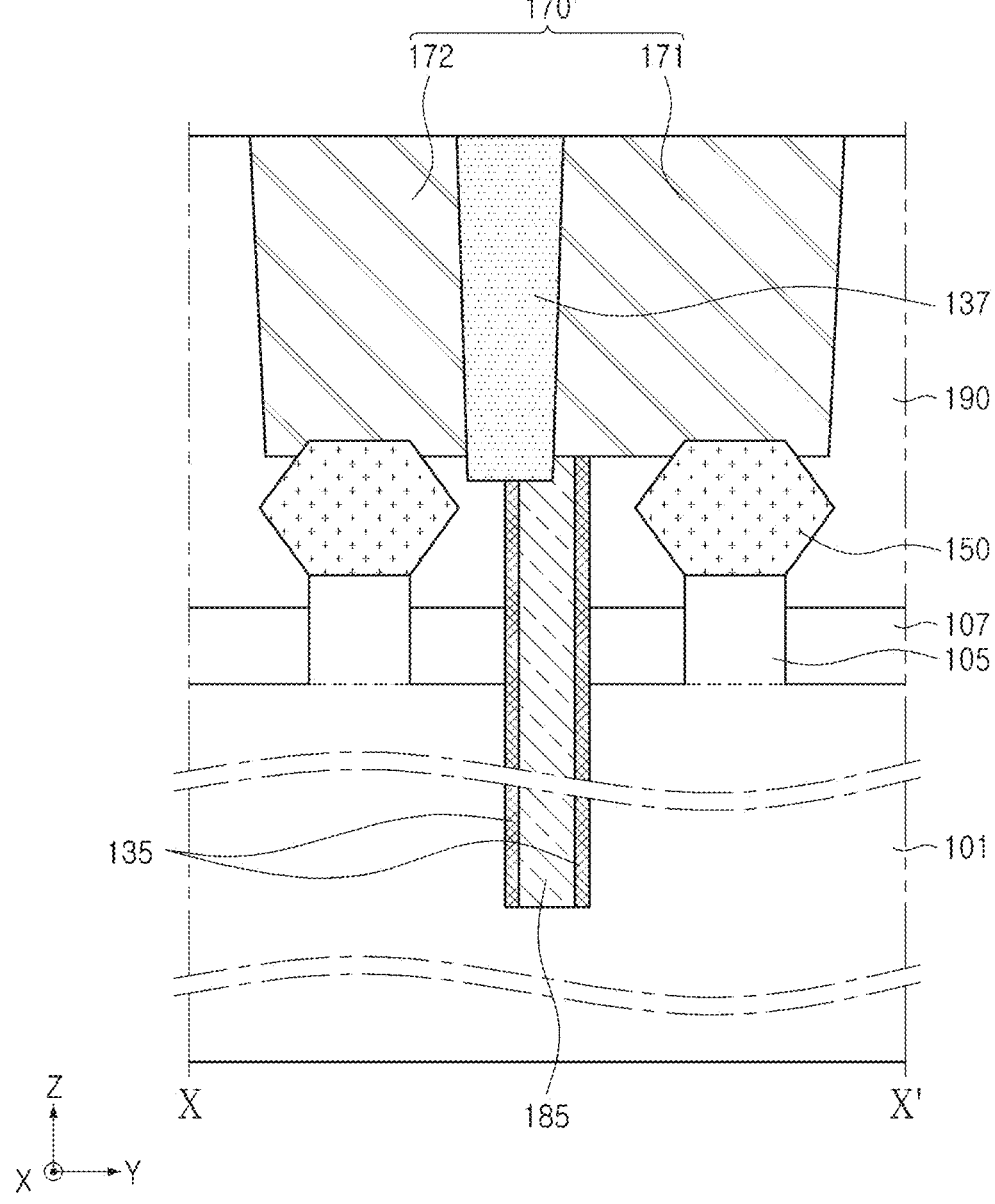

FIGS. 15 to 17 are views illustrated in process order to illustrate a method of manufacturing a semiconductor device according to example embodiments. FIGS. 15 to 17 illustrate some example embodiments of a method of manufacturing the semiconductor device 100b of FIG. 4.

FIG. 15 is a plan view sequentially illustrating a method of manufacturing a semiconductor device according to example embodiments of the present inventive concepts, and FIGS. 16 and 17 are cross-sectional views illustrating a region, taken along line X-X' of FIG. 15.

Referring to FIGS. 15 and 16, active regions 105, source/drain regions 150, gate structures 160, and a vertical conductive structure 185 may be formed, and a contact plug 170' may be formed.

First, the active regions 105, the source/drain regions 150, the gate structures 160, and the vertical conductive structure 185 may be formed, similarly to those described with reference to FIGS. 9 to 10B.

Before forming a contact separation pattern 137, the contact plugs 170' may be formed first. The contact plugs 170' may be formed by forming openings exposing adjacent source/drain regions 150, filling the openings with a conductive material, and performing a planarization process. In this operation, a process of partially removing a portion of an upper end of the vertical conductive structure 185 and a process of forming the gap-fill insulating layer 190', of FIGS. 11A and 11B, may be omitted.

Referring to FIG. 17, a contact separation pattern 137 separating the contact plugs 170' into first and second contact plugs 171 and 172 may be formed.

The contact separation pattern 137 may be formed by filling openings passing through the contact plugs 170' with an insulating material, for example, silicon nitride. The contact separation pattern 137 may have a lower end that may be the same or substantially the same as or lower than lower ends of the contact plugs 170'. Thereafter, a process of forming upper and lower interconnection structures 181, 182, and 183 may be performed to form the semiconductor device 100*b* of FIG. 4.

The contact plugs 170' contacting the vertical conductive structure 185 may be first formed on the vertical conductive structure 185, and an etching process for forming an opening corresponding to the contact separation pattern 137 may be performed. A contact area between the plugs 170' and the vertical conductive structure 185 may be secured. In addition, an etching process condition may be adjusted, according to a relatively small number of materials (e.g., limited to only materials of, for example, the contact plugs 170', but not the gate separation pattern 135 and the vertical conductive structure 185), to relatively improve process difficulty.

According to some example embodiments of the present inventive concepts, a contact separation pattern having a portion contacting an upper surface of a vertical conductive structure may be formed to provide a semiconductor device having improved electrical characteristics or productivity.

When the terms "about" or "substantially" are used in this specification in connection with a numerical value, it is intended that the associated numerical value includes a manufacturing or operational tolerance (e.g., ±10%) around the stated numerical value.

Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The various advantages and effects of the present inventive concepts are not limited to the above, and will be more easily understood in the process of describing specific embodiments of the present inventive concept.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
active regions, parallel to each other, on a substrate and respectively extending in a first horizontal direction;
gate structures intersecting the active regions on the substrate, extending in a second horizontal direction, the gate structures including a first gate structure and a second gate structure opposing each other in the second horizontal direction;
source/drain regions including a first source/drain region and a second source/drain region, on at least one side of the gate structures and on the active regions;
a gate separation pattern between the first and second gate structures;
a vertical conductive structure in the gate separation pattern;
contact plugs including a first contact plug electrically connected to the first source/drain region and connected to the vertical conductive structure, and a second contact plug electrically connected to the second source/drain region and spaced apart from the vertical conductive structure; and

18 a contact separation pattern separating the first and second contact plugs between the first and second contact plugs,
wherein the contact separation pattern has a portion contacting an upper surface of the vertical conductive structure on the vertical conductive structure.

2. The semiconductor device of claim 1, wherein the first contact plug is in contact with the contact separation pattern.

3. The semiconductor device of claim 1, wherein
a lower surface of the contact separation pattern is in contact with the vertical conductive structure and the gate separation pattern, and
the lower surface of the contact separation pattern includes a first surface contacting the vertical conductive structure, and a second surface contacting the gate separation pattern and coplanar with the first surface.

4. The semiconductor device of claim 1, wherein an upper surface of the contact separation pattern is coplanar with upper surfaces of the contact plugs.

5. The semiconductor device of claim 1, wherein a flat area of an upper portion of the contact separation pattern is smaller than a flat area of a lower portion of the contact separation pattern.

6. The semiconductor device of claim 1, wherein the gate separation pattern surrounds an outer side surface of the vertical conductive structure.

7. The semiconductor device of claim 6, wherein the gate separation pattern has a uniform thickness on the outer side surface of the vertical conductive structure.

8. The semiconductor device of claim 6, wherein the gate separation pattern has a non-uniform thickness on the outer side surface of the vertical conductive structure.

9. The semiconductor device of claim 1, wherein a height level of an uppermost surface of the gate separation pattern is higher than a height level of an uppermost surface of the vertical conductive structure.

10. The semiconductor device of claim 9, wherein the gate separation pattern comprises a portion protruding from a side surface of the vertical conductive structure in an upward direction.

11. The semiconductor device of claim 1, wherein a height level of a lower end of the contact separation pattern is higher than height levels of lower ends of the contact plugs.

12. The semiconductor device of claim 1, wherein the contact separation pattern passes through the contact plugs, and has a height level of a lower end, lower than height levels of lower ends of the contact plugs.

13. The semiconductor device of claim 1, wherein
the vertical conductive structure comprises a first plug layer and a first barrier layer surrounding an outer side surface and a bottom surface of the first plug layer, and
each of the contact plugs comprises a second plug layer and a second barrier layer surrounding an outer side surface and a bottom surface of the second plug layer.

14. A semiconductor device comprising:
a substrate having a first surface and a second surface opposing the first surface;
active regions, parallel to each other, on the first surface of the substrate and respectively extending in a first horizontal direction;
a plurality of channel layers stacked to be spaced apart from each other in a vertical direction on the active regions;
gate structures intersecting the active regions and the plurality of channel layers on the first surface of the substrate, extending in a second horizontal direction, and including a first gate structure and a second gate structure opposing each other in the second horizontal direction;

a first source/drain region and a second source/drain region, on at least one side of the gate structures and on the active regions;

a gate separation pattern between the first and second gate structures;

lower interconnection lines below the second surface of the substrate;

a vertical conductive structure in the gate separation pattern and electrically connected to the lower interconnection lines;

a contact separation pattern on the vertical conductive structure to contact the vertical conductive structure; and contact plugs including a first contact plug electrically connected to the first source/drain region and the vertical conductive structure, and a second contact plug electrically connected to the second source/drain region and spaced apart from the vertical conductive structure, wherein the contact separation pattern separates the first and second contact plugs between the first and second contact plugs.

15. The semiconductor device of claim 14, wherein a height level of an upper surface of the vertical conductive structure is higher than a height level of an upper surface of an uppermost channel layer, among the plurality of channel layers, and is lower than height levels of upper surfaces of the gate structures.

16. The semiconductor device of claim 14, wherein the contact separation pattern includes at least one of silicon nitride, silicon carbonitride, or silicon oxynitride and the gate separation pattern includes at least one of silicon nitride, silicon carbonitride, or silicon oxynitride.

17. The semiconductor device of claim 14, wherein an upper surface of the vertical conductive structure is in contact with the contact separation pattern and the first contact plug.

18. A semiconductor device comprising:

a substrate having a first surface and a second surface opposing the first surface;

active regions, parallel to each other, on the first surface of the substrate and respectively extending in a first horizontal direction;

gate structures intersecting the active regions on the first surface of the substrate and extending in a second horizontal direction;

a gate separation pattern between the gate structures;

source/drain regions including a first source/drain region and a second source/drain region, on at least one side of the gate structures and on the active regions;

lower interconnection lines on the second surface of the substrate;

a vertical conductive structure in the gate separation pattern and passing through the substrate and electrically connected to the lower interconnection lines;

a contact separation pattern on the vertical conductive structure to contact the vertical conductive structure; and contact plugs including a first contact plug electrically connected to the first source/drain region and the vertical conductive structure, and a second contact plug electrically connected to the second source/drain region and spaced apart from the vertical conductive structure, wherein the contact separation pattern separates the first and second contact plugs between the first and second contact plugs, and a width of an upper portion of the contact separation pattern is narrower than a width of a lower portion of the contact separation pattern, in the second horizontal direction.

19. The semiconductor device of claim 18, wherein an upper surface of the contact separation pattern is coplanar with upper surfaces of the contact plugs.

20. The semiconductor device of claim 18, further comprising a plurality of channel layers spaced apart from each other on the active regions, wherein each of the gate structures surrounds the plurality of channel layers.

* * * * *